United States Patent
Sasaki

(10) Patent No.: US 11,264,290 B2
(45) Date of Patent: Mar. 1, 2022

(54) TUNNEL MAGNETORESISTIVE EFFECT ELEMENT AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/080,788

(22) PCT Filed: Sep. 6, 2017

(86) PCT No.: PCT/JP2017/032148
§ 371 (c)(1),
(2) Date: Aug. 29, 2018

(87) PCT Pub. No.: WO2019/049244
PCT Pub. Date: Mar. 14, 2019

(65) Prior Publication Data
US 2019/0333819 A1  Oct. 31, 2019

(51) Int. Cl.
*H01L 21/8239*  (2006.01)
*G01R 33/09*  (2006.01)
(Continued)

(52) U.S. Cl.
CPC ........ *H01L 21/8239* (2013.01); *G01R 33/098* (2013.01); *G11C 11/161* (2013.01);
(Continued)

(58) Field of Classification Search
CPC ... H01L 21/8239; H01L 27/222; H01L 43/02; H01L 43/10; H01L 43/08; H01L 27/105;
(Continued)

(56) References Cited

U.S. PATENT DOCUMENTS 8,592,927 B2  11/2013  Jan et al.
8,698,260 B2  4/2014  Jan et al.
(Continued)

FOREIGN PATENT DOCUMENTS

JP  5586028 B2  9/2014
JP  2014-187169 A  10/2014
(Continued)

OTHER PUBLICATIONS

Aaltonen et al., Ruthenium Thin Films Grown by Atomic Layer Deposition, Chem. Vap. Deposition 2003, 9, No. 1 (Year: 2003).*
(Continued)

*Primary Examiner* — Shih Tsun A Chou
(74) *Attorney, Agent, or Firm* — Oliff PLC

(57) ABSTRACT

A TMR element includes a reference layer, a magnetization free layer, a tunnel barrier layer between the reference layer and the magnetization free layer, and a perpendicular magnetization inducing layer and a leakage layer stacked on a side of the magnetization free layer opposite to the tunnel barrier layer side. A magnetization direction of the reference layer is fixed along a stack direction. The perpendicular magnetization inducing layer imparts magnetic anisotropy along the stack direction to the magnetization free layer. The leakage layer is disposed on an end portion region in an in-plane direction of the magnetization free layer. The perpendicular magnetization inducing layer is disposed on at least a central region in the in-plane direction of the magnetization free layer. A resistance value of the leakage layer along the stack direction per unit area in plane is less than that of the perpendicular magnetization inducing layer.

2 Claims, 25 Drawing Sheets

(51) Int. Cl.
- *H01F 10/32* (2006.01)
- *G11C 11/16* (2006.01)
- *H01L 27/105* (2006.01)
- *H01L 27/22* (2006.01)
- *H01L 29/66* (2006.01)
- *H01L 29/82* (2006.01)
- *H01L 43/08* (2006.01)
- *H01L 43/10* (2006.01)
- *H01L 43/02* (2006.01)

(52) U.S. Cl.
CPC ..... *H01F 10/3286* (2013.01); *H01F 10/3295* (2013.01); *H01L 27/105* (2013.01); *H01L 27/222* (2013.01); *H01L 27/228* (2013.01); *H01L 29/66984* (2013.01); *H01L 29/82* (2013.01); *H01L 43/02* (2013.01); *H01L 43/08* (2013.01); *H01L 43/10* (2013.01)

(58) Field of Classification Search
CPC ... H01L 27/228; H01L 29/82; H01F 10/3286; H01F 10/3295; G11C 11/161; G01R 33/098

See application file for complete search history.

(56) References Cited

U.S. PATENT DOCUMENTS

| | | | |
|---|---|---|---|
| 8,710,603 B2 | 4/2014 | Jan et al. | |
| 8,860,156 B2 | 10/2014 | Beach et al. | |
| 8,921,961 B2 | 12/2014 | Kula et al. | |
| 9,006,704 B2 | 4/2015 | Jan et al. | |
| 2011/0249485 A1* | 10/2011 | Fujita | G11C 11/1659 365/148 |
| 2012/0091548 A1 | 4/2012 | Sukegawa et al. | |
| 2013/0221461 A1 | 8/2013 | Sukegawa et al. | |
| 2014/0284736 A1* | 9/2014 | Toko | H01L 43/12 257/421 |
| 2016/0072043 A1 | 3/2016 | Park et al. | |
| 2016/0351238 A1* | 12/2016 | Doyle | H01L 43/12 |
| 2017/0148848 A1* | 5/2017 | Ahn | H01L 43/10 |
| 2018/0351086 A1* | 12/2018 | Tang | H01L 43/08 |

FOREIGN PATENT DOCUMENTS

| | | |
|---|---|---|
| JP | 5988019 B2 | 9/2016 |
| JP | 2017-041606 A | 2/2017 |

OTHER PUBLICATIONS

Sharma et al., Electrical properties of magnesium oxide thin films, Optoelectronics and Advanced Materials—Rapid Communications vol. 2, No. 10, Oct. 2008, p. 640-642 (Year: 2008).*

Mar. 19, 2020 International Preliminary Report on Patentability issued in International Patent Application No. PCT/JP2017/032148.

* cited by examiner

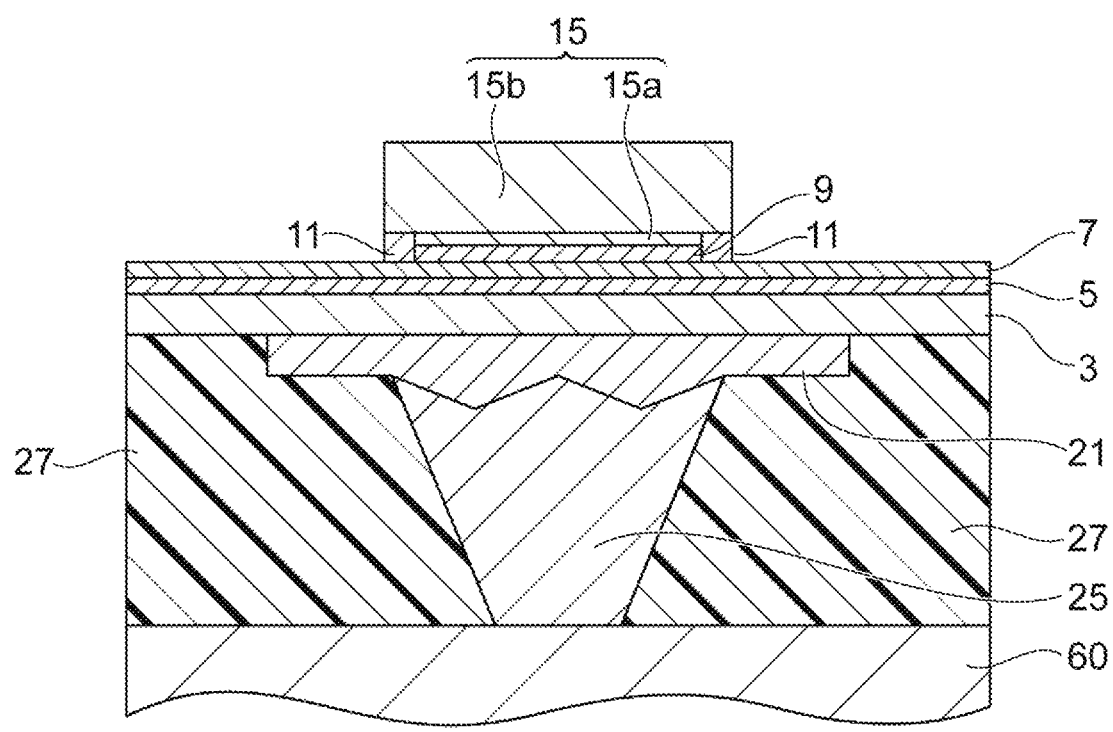
Fig.17
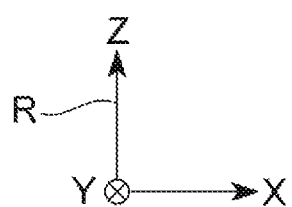

TUNNEL MAGNETORESISTIVE EFFECT ELEMENT AND MAGNETIC MEMORY

TECHNICAL FIELD

The present disclosure relates to a tunnel magnetoresistive effect element and a magnetic memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize a high MR ratio, compared to the GMR element that uses a conductive layer as the non-magnetic spacer layer. Thus, the TMR element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element. For example, applying this technology to the MRAM can reduce the size of a memory cell and thus can achieve high density for the reason that an interconnect for magnetic field generation for reversing the magnetization direction of the magnetization free layer is not necessary. Generally, the MRAM that uses the magnetization reversal technology based on the STT is called an "STT-MRAM".

In addition, the use of the TMR element that has perpendicular magnetic anisotropy is considered in order to further achieve high density in the MRAM or the like (for example, Patent Literatures 3 to 5 below). In such a TMR element, the magnetization direction of the reference layer is fixed along a perpendicular direction (the stack direction of the element; that is, a direction orthogonal to the in-plane direction of each layer), and the easy magnetization axis of the magnetization free layer is also along the perpendicular direction. Accordingly, since the amount of current needed for spin injection magnetization reversal can be reduced, the size of a selection transistor for selecting the TMR element can be reduced. Consequently, in the case of using the TMR element having perpendicular magnetic anisotropy, high density can be achieved since the size of the memory cell can be reduced compared to that in the case of using the TMR element that has in-plane magnetic anisotropy.

CITATION LIST

Patent Literature

[Patent Literature 1] Japanese Patent No. 5586028
[Patent Literature 2] Japanese Patent No. 5988019
[Patent Literature 3] U.S. Pat. No. 8,921,961
[Patent Literature 4] U.S. Pat. No. 8,860,156
[Patent Literature 5] U.S. Pat. No. 9,006,704

Summary

In order to achieve a high density STT-MRAM, it is important to reduce the size of the selection transistor by reducing a reversal current needed for spin injection magnetization reversal while using the TMR element having perpendicular magnetic anisotropy (perpendicular magnetization type TMR element). In order to achieve the perpendicular magnetization TMR element, the easy magnetization axis of the magnetization free layer needs to be directed in the perpendicular direction. However, since the magnetization free layer has a layer shape, shape magnetic anisotropy acts to direct the easy magnetization axis of the magnetization free layer in the in-plane direction. Thus, magnetic anisotropy needs to be imparted to the magnetization free layer in the perpendicular direction using any method.

One of methods for inducing perpendicular magnetic anisotropy in the magnetization free layer is a method of inducing perpendicular magnetization in the magnetization free layer using interface magnetic anisotropy. In this method, perpendicular magnetization anisotropy is imparted to the magnetization free layer such that the direction of magnetization is directed in the perpendicular direction by setting the spin-orbit interaction in the interface between the magnetization free layer and the layer in contact with the magnetization free layer to be stronger than the shape magnetic anisotropy of the magnetization free layer. When the film thickness of the magnetization free layer is sufficiently decreased (for example, approximately 1 nm), the magnetization direction of the magnetization free layer that is in contact with the tunnel barrier layer can be directed in the perpendicular direction by forming the tunnel barrier layer of a material that imparts such interface magnetic anisotropy to the magnetization free layer. Furthermore, when a layer (perpendicular magnetization inducing layer) that imparts such interface magnetic anisotropy to the magnetization free layer is stacked on the surface of the magnetization free layer opposite to the surface of the magnetization free layer in contact with the tunnel barrier layer, the perpendicular magnetic anisotropy of the magnetization free layer is further increased. Consequently, even when the magnetization free layer is thicker (for example, approximately 2 nm), the magnetization direction of the magnetization free layer can be directed in the perpendicular direction. Such a perpendicular magnetization inducing layer can be formed of an oxide material such as MgO or $MgAl_2O_4$ (non-magnetic spinel material) and so on.

However, since the perpendicular magnetization inducing layer is formed of a material having high resistivity such as an oxide, the resistance of the TMR element is increased. Thus, the amount of spin-polarized current that flows through the magnetization free layer at the time of spin injection magnetization reversal is reduced. Consequently, since the magnetization reversal of the magnetization free layer does not easily occur, a problem arises in that the amount of current (reversal current) needed for causing magnetization reversal is increased. When the amount of reversal current is increased, a problem may arise in that the electric power consumption of a device in which the TMR element is used is increased, or the reliability of the device in which the TMR element is used is decreased.

The present disclosure is conceived in view of the above problem. An object of the present disclosure is to provide a perpendicular magnetization TMR element in which the amount of reversal current is reduces, and a magnetic memory that uses the TMR element.

In order to resolve the above problem, a tunnel magnetoresistive effect (TMR) element according to one aspect of the present disclosure includes a reference layer, a magnetization free layer, a tunnel barrier layer stacked in a stack direction between the reference layer and the magnetization free layer, a perpendicular magnetization inducing layer and a leakage layer stacked on a side of the magnetization free layer opposite to the tunnel barrier layer side, and a side wall portion formed of an insulation material and covering side surfaces of the reference layer, the tunnel barrier layer, the magnetization free layer, the perpendicular magnetization inducing layer, and the leakage layer. A magnetization direction of the reference layer is fixed along the stack direction. The perpendicular magnetization inducing layer imparts magnetic anisotropy along the stack direction to the magnetization free layer. The leakage layer is disposed on an end portion region in an in-plane direction of the magnetization free layer. The perpendicular magnetization inducing layer is disposed on at least a central region in an in-plane direction of the magnetization free layer. A resistance value of the leakage layer along the stack direction per unit area in plane is less than a resistance value of the perpendicular magnetization inducing layer along the stack direction per unit area in plane.

In the TMR element according to one aspect of the present disclosure, the leakage layer of which the resistance value along the stack direction per unit area in plane is less than the resistance value of the perpendicular magnetization inducing layer along the stack direction per unit area in plane is disposed on the end portion region in the in-plane direction of the magnetization free layer. Thus, a spin-polarized current can flow through the magnetization free layer via not only the perpendicular magnetization inducing layer but also the leakage layer. A part of the spin-polarized current that flows through the end portion region of the magnetization free layer via the leakage layer flows through the end portion region in the in-plane direction, and thus, induces drive of magnetic domain walls in the end portion region. In addition, in the end portion region that is close to the leakage layer, the amount of spin-polarized current that flows via the tunnel barrier layer is increased. Thus, magnetization is easily reversed. Accordingly, the reversal of the magnetization of the end portion region where the magnetization direction is particularly not easily reversed in the magnetization free layer is promoted by the induced drive of the magnetic domain walls. Thus, according to the TMR element according to one aspect of the present disclosure, the amount of reversal current can be reduced.

Furthermore, in the TMR element according to one aspect of the present disclosure, the leakage layer may be formed of a metal that includes at least one of W, Ta, Mo, Nb, and Ru. Accordingly, since W, Ta, Mo, Nb, and Ru are metals that have high thermal resistance, melting of the leakage layer and the occurrence of migration of the metal constituting the leakage layer can be suppressed even when a large amount of current flows through the leakage layer.

Furthermore, in the TMR element according to one aspect of the present disclosure, in a cross section parallel to the stack direction, a width in an in-plane direction of the leakage layer may be greater than a thickness of the perpendicular magnetization inducing layer. Accordingly, since a sufficiently large amount of spin-polarized current can flow through the leakage layer, the amount of reversal current can be particularly reduced.

Furthermore, in the TMR element according to one aspect of the present disclosure, at least one of the tunnel barrier layer and the perpendicular magnetization inducing layer may be formed of an oxide material, and the side wall portion may be formed of a nitride material. Accordingly, since the side wall portion is formed of the nitride material, the movement of the oxygen atoms of the tunnel barrier layer and/or the perpendicular magnetization inducing layer formed of the oxide material to the side wall portion can be suppressed.

Furthermore, in the TMR element according to one aspect of the present disclosure, each of the tunnel barrier layer and the perpendicular magnetization inducing layer may be formed of MgO or an oxide material that has a spinel structure represented by a general formula $AB_2O_4$ (in the formula, A is at least one kind of element selected from a group consisting of Mg and Zn, and B is at least one kind of element selected from a group consisting of Al, Ga, and In). Accordingly, since these materials can particularly effectively impart magnetic anisotropy along the stack direction to the magnetization free layer, the direction of the easy magnetization axis of the magnetization free layer can be particularly stably set along a perpendicular direction.

Furthermore, in the TMR element according to one aspect of the present disclosure, the tunnel barrier layer and the perpendicular magnetization inducing layer may be formed of an oxide material that has a spinel structure represented by the general formula $AB_2O_4$, and at least one of an A site or a B site of the spinel structure may be occupied by a plurality of elements. Accordingly, a strain in the interface between the tunnel barrier layer and the magnetization free layer, and a strain in the interface between the perpendicular magnetization inducing layer and the magnetization free layer can be easily suppressed. Furthermore, the resistance value of each of the tunnel barrier layer and the perpendicular magnetization inducing layer can be easily controlled.

Furthermore, in the TMR element according to one aspect of the present disclosure, the tunnel barrier layer and the perpendicular magnetization inducing layer may be formed of an oxide material that has a spinel structure represented by the general formula $AB_2O_4$, and each of an A site and a B site of the spinel structure may be occupied by a plurality of elements. Accordingly, a strain in the interface between the tunnel barrier layer and the magnetization free layer, and a strain in the interface between the perpendicular magnetization inducing layer and the magnetization free layer can be more easily suppressed. Furthermore, the resistance value of each of the tunnel barrier layer and the perpendicular magnetization inducing layer can be more easily controlled.

Furthermore, the TMR element according to one aspect of the present disclosure may further include a mask layer formed of a conductive material and stacked on the perpendicular magnetization inducing layer and the leakage layer. Accordingly, the TMR element having the above configuration can be easily manufactured using a manufacturing method that includes an etching step using the mask layer.

In addition, a magnetic memory according to one aspect of the present disclosure includes any of the above-mentioned TMR elements as a storage element.

In addition, a built-in memory according to one aspect of the present disclosure includes the magnetic memory.

According to the present disclosure, a TMR element and a magnetic memory in which the amount of reversal current is reduced are provided.

BRIEF DESCRIPTION OF DRAWINGS

FIG. 17 is a view illustrating a cross-section for describing the first specific example of the manufacturing method for the TMR element.

DESCRIPTION OF EMBODIMENTS

Figure 1:
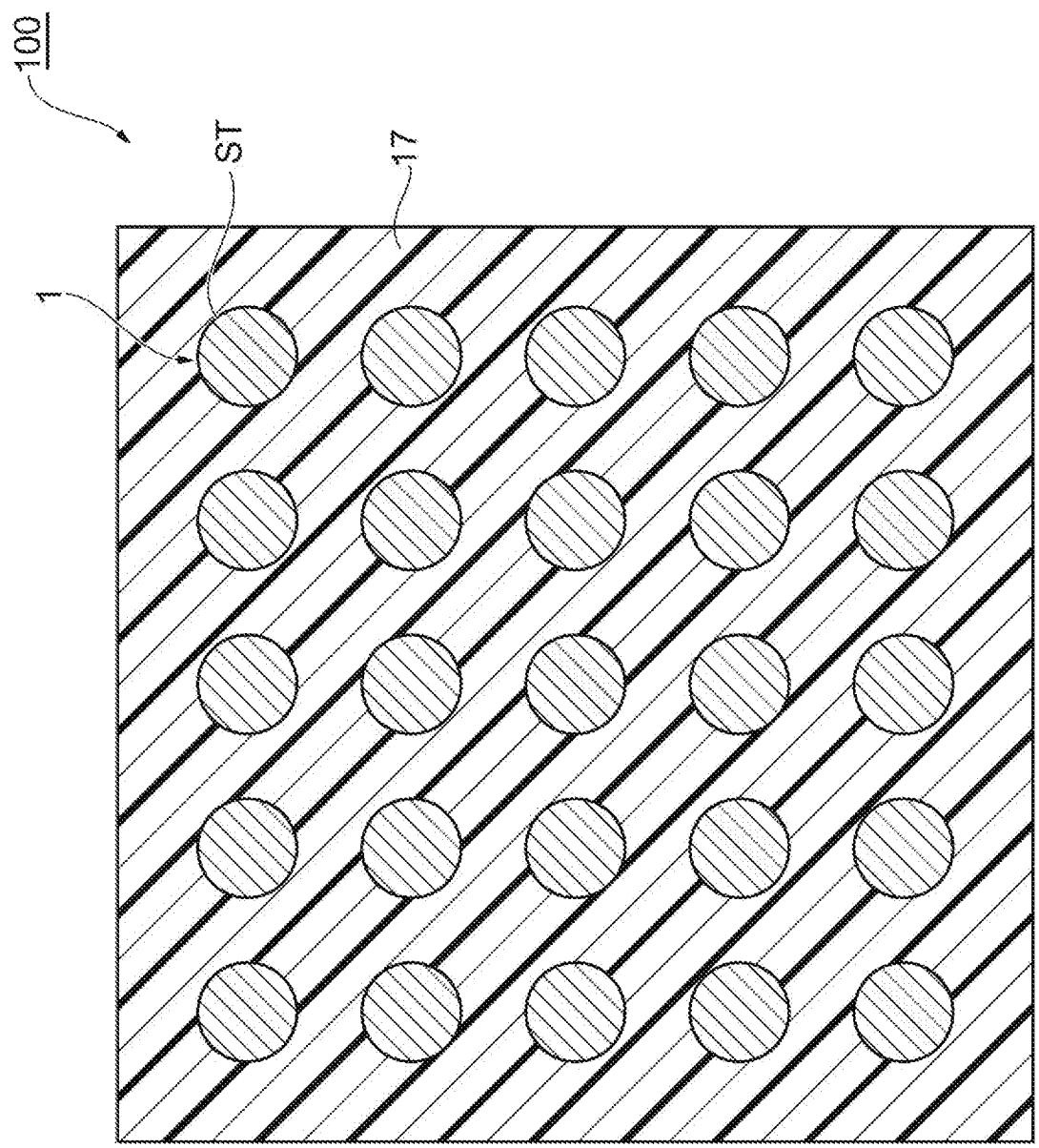
FIG. 1 is a cross-sectional plan view of an MRAM that includes a TMR element of an embodiment.

Hereinafter, an embodiment of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

Figure 2:
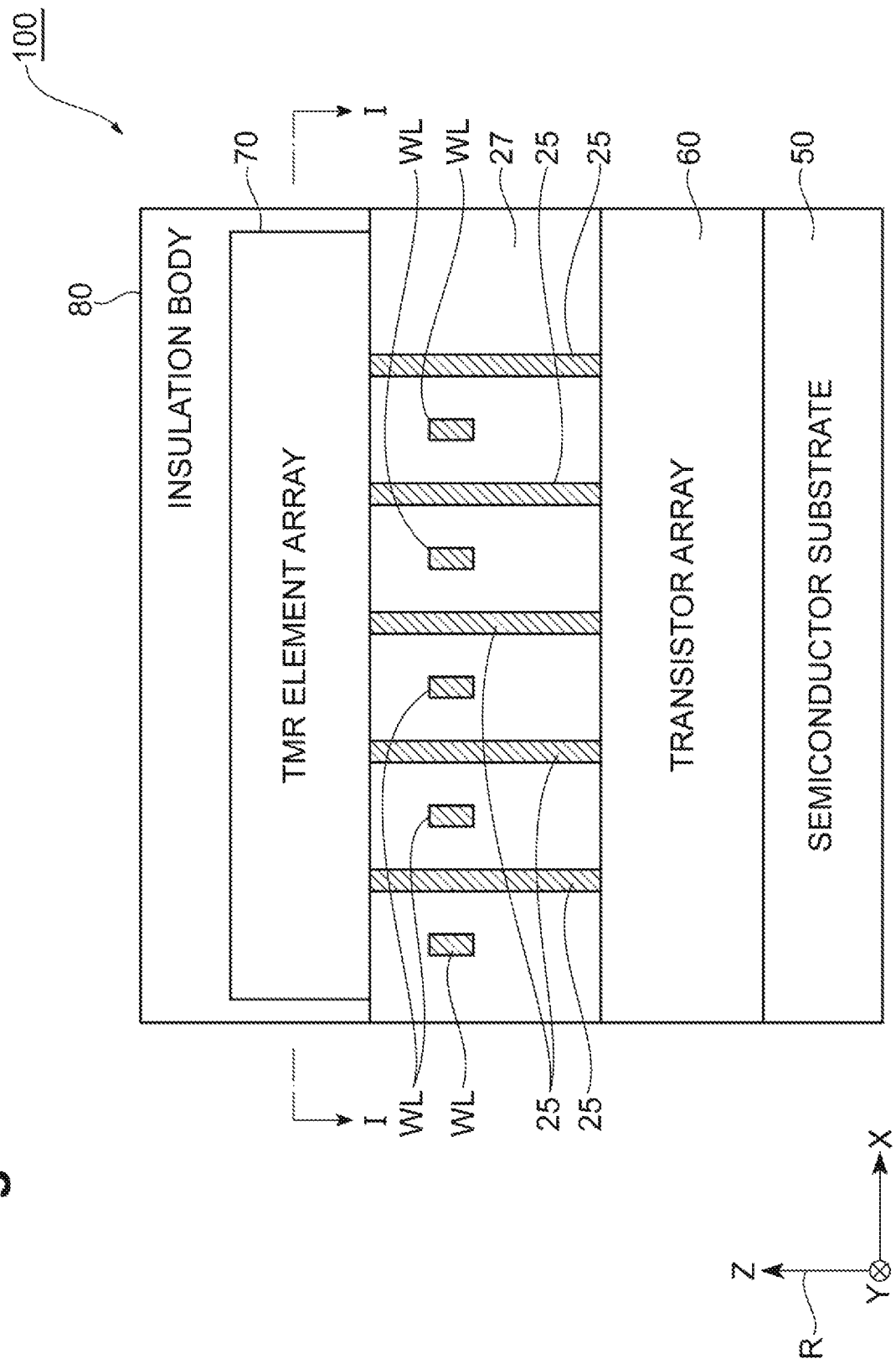
FIG. 2 is a schematic view of a vertical cross-section of the MRAM according to the embodiment.

FIG. 1 is a cross-sectional plan view of a magnetic memory (magnetoresistive random access memory; MRAM) that includes a perpendicular magnetization tunnel magnetoresistive effect (TMR) element according to the present embodiment. FIG. 2 is a schematic view of a vertical cross-section of the MRAM according to the present embodiment. FIG. 1 corresponds to a cross-section of an MRAM 100 taken along line I-I in FIG. 2. An orthogonal coordinate system R is illustrated in FIG. 1 and the subsequent drawings when necessary.

As illustrated in FIG. 1, the MRAM 100 of the present embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion ST and a side wall portion 17 in which the stack portion ST is embedded. In addition, as illustrated in FIG. 2, the MRAM 100 includes a semiconductor substrate 50, a transistor array 60, a via interconnect part 25, an interlayer insulation layer 27, a word line WL, a TMR element array 70, and an insulation body 80 that covers the upper surface and the side surface of the TMR element array 70.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
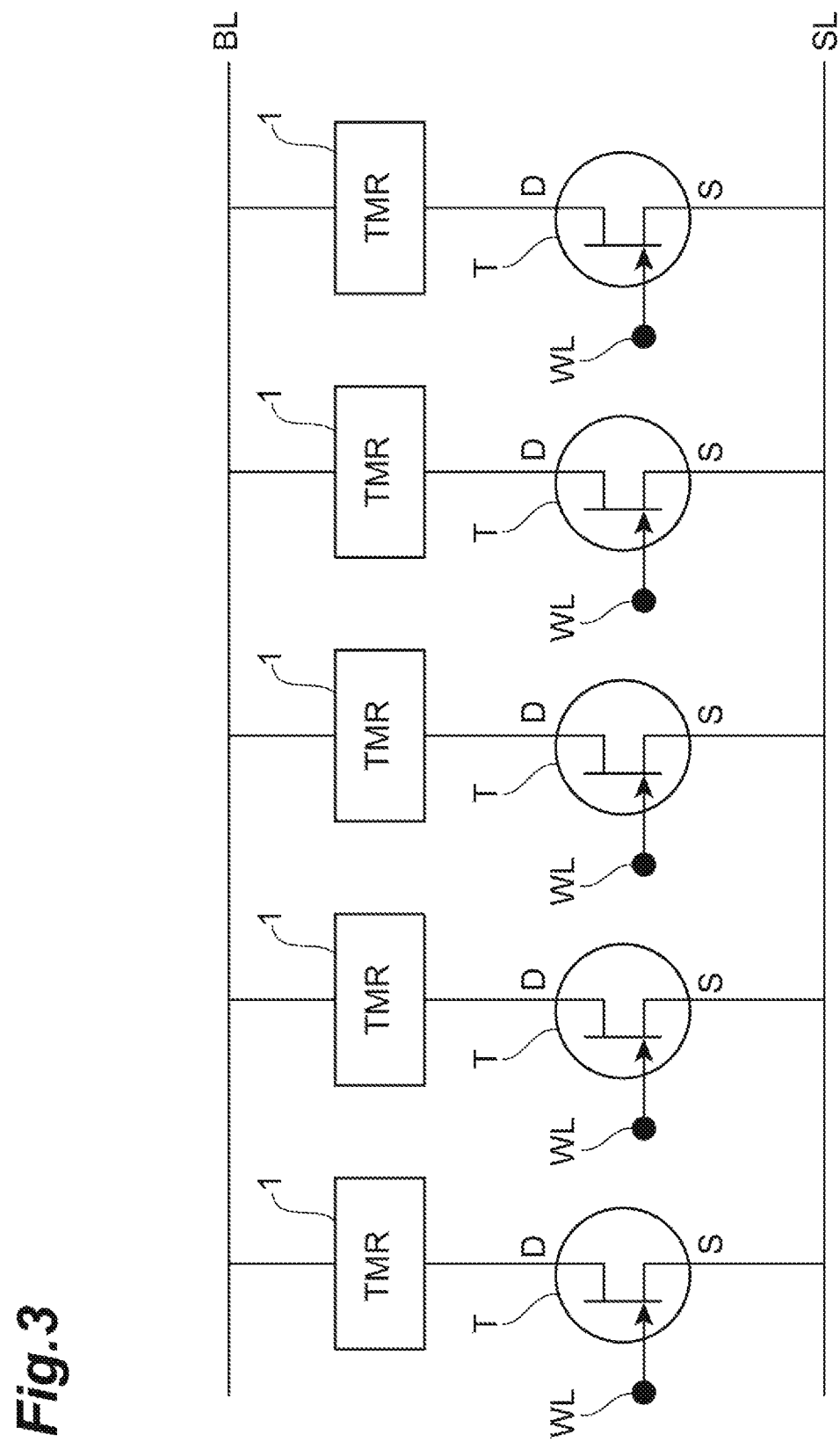
FIG. 3 is a view illustrating the electrical connection of the MRAM of the embodiment.

FIG. 3 is a view illustrating the electrical connection of the MRAM of the present embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain D of each transistor T, respectively. The other end of each TMR element 1 is electrically connected to a bit line BL. The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cells of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
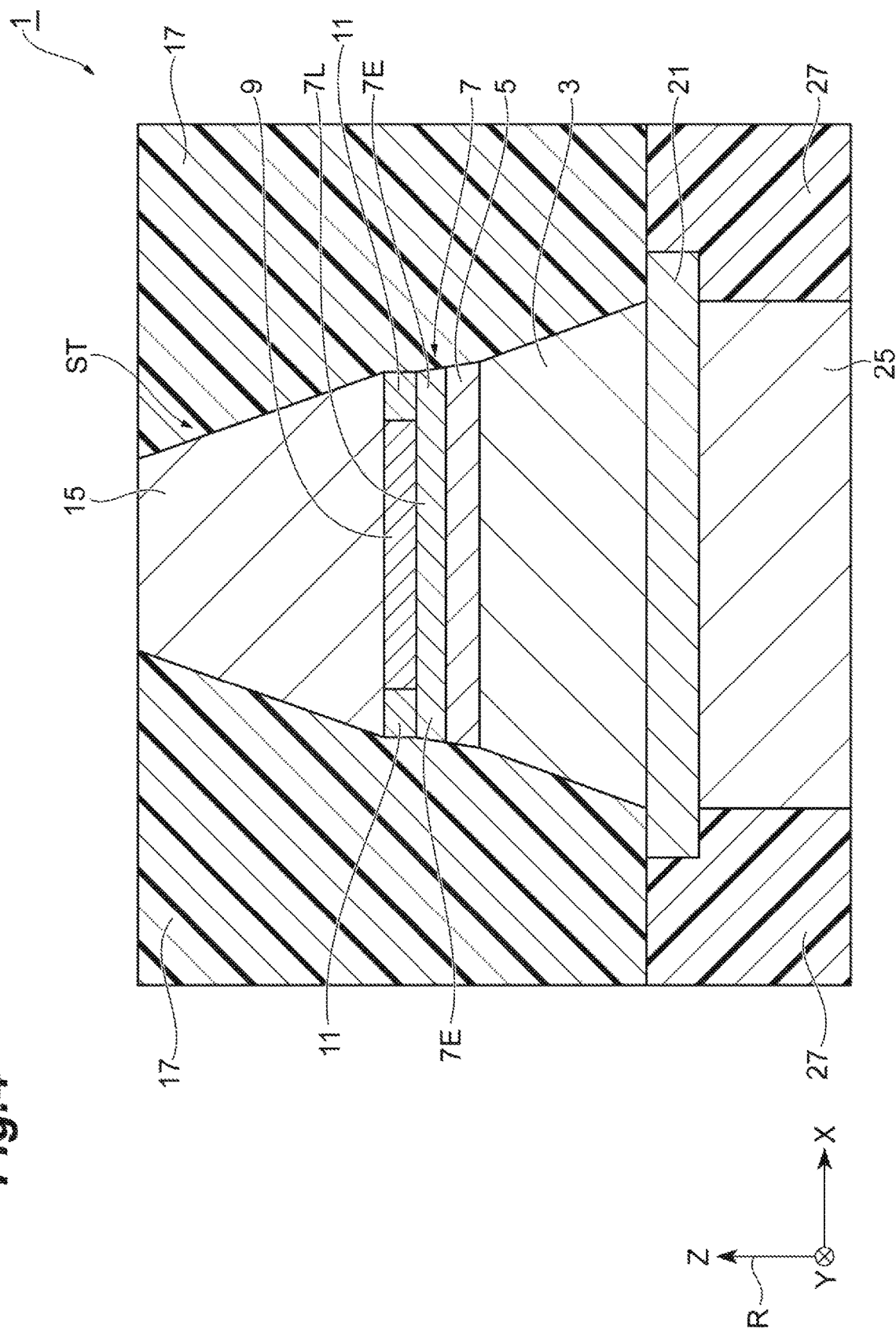
FIG. 4 is a cross-sectional view in the vicinity of the TMR element of the MRAM of the embodiment.

Next, a detailed configuration of each TMR element 1 of the present embodiment will be described. FIG. 4 is a cross-sectional view in the vicinity of the TMR element of the MRAM of the present embodiment. FIG. 4 illustrates a cross-section in the vicinity of one TMR element 1 in the vertical cross-section of the MRAM 100 illustrated in FIG. 2.

As illustrated in FIG. 4, the stack portion ST of the TMR element 1 is disposed on a base layer 21 that is disposed on the via interconnect part 25. The via interconnect part 25 is formed of a conductive material, for example, formed of a metal such as Cu. The base layer 21 is formed of a conductive material, for example, formed of a conductive oxide, a conductive nitride, a conductive oxynitride, or a silicide. Thus, the lower surface of a reference layer 3, which is one end of the TMR element 1 of the present embodiment, is electrically connected to the drain D (refer to FIG. 3) of the transistor T through the base layer 21 and the via interconnect part 25.

The base layer 21 is disposed in order to improve the flatness of each layer of the stack portion ST, particularly, a tunnel barrier layer described later. Thus, the flatness of the upper surface of the base layer 21 is set to be higher than the flatness of the upper surface of the via interconnect part 25. The upper surface of the base layer 21 has high flatness and extends along the XY plane. The stack portion ST is formed on the upper surface of the base layer 21. The via interconnect part 25 and the base layer 21 are embedded in the interlayer insulation layer 27 and, by the interlayer insulation layer 27, are electrically insulated from the via interconnect parts and the base layers that are electrically connected to the other TMR elements 1.

The TMR element 1 includes the stack portion ST and the side wall portion 17 that is formed of an insulation material which covers the side surface of each layer of the stack portion ST. The stack portion ST is composed of a plurality of layers that are stacked in a Z-axis direction which is a stack direction. Specifically, the stack portion ST is constituted by stacking the reference layer 3 functioning as a magnetization fixed layer, a tunnel barrier layer 5, the magnetization free layer 7, a perpendicular magnetization inducing layer 9, a leakage layer 11, and a mask layer 15 in this order. Thus, the tunnel barrier layer 5 is stacked in the Z-axis direction between the reference layer 3 and the magnetization free layer 7. The perpendicular magnetization inducing layer 9 and the leakage layer 11 are stacked on the side of the magnetization free layer 7 opposite to the tunnel barrier layer 5 side.

The reference layer 3 is formed of a ferromagnetic material such as Co, a Co—Fe alloy, or a Co—Fe—B alloy. The magnetization direction of the reference layer 3 is substantially fixed along the Z-axis direction. The thickness of the reference layer 3 in the Z-axis direction can be, for example, greater than or equal to 3 nm and less than or equal to 10 nm. In addition, the reference layer 3 can have a structure in which a multilayer film such as Co/Pt or Co/Ni is repeatedly stacked such that the magnetization direction of each magnetic layer is in a perpendicular direction.

Furthermore, the reference layer 3 can have a structure in which magnetic fields that occur in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably configured to induce perpendicular magnetic anisotropy in the magnetization free layer 7 based on the same principle as the perpendicular magnetization inducing layer 9 described later. The reason is that the perpendicular magnetization of the magnetization free layer 7 is more stable, and the film thickness of the magnetization free layer 7 can be increased. The material constituting the tunnel barrier layer 5 that may induce perpendicular magnetic anisotropy in the magnetization free layer 7 can be exemplified, for example, by MgO, ZnO, $GaO_X$, or an oxide material that has a spinel structure represented by general formula $AB_2O_4$ (in the formula, A is at least one kind of element selected from a group consisting of Mg and Zn, and B is at least one kind of element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of a non-magnetic metal material such as Cu or Ag, or a semiconductor material such as Si or Ge.

The thickness of the tunnel barrier layer 5 in the Z-axis direction is small enough such that a tunnel current flows through the tunnel barrier layer 5 in the Z-axis direction when a voltage is applied between the reference layer 3 and the magnetization free layer 7. The thickness of the tunnel barrier layer 5 in the Z-axis direction can be, for example, greater than or equal to 1 nm and less than or equal to 3 nm.

In addition, in the present embodiment, the tunnel barrier layer 5 is formed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the perpendicular magnetization inducing layer 9 described later. If the easy magnetization axis of the magnetization free layer 7 can be sufficiently stably directed in the direction along the Z axis by the action and the like of the perpendicular magnetization inducing layer 9, the tunnel barrier layer 5 may be formed of a material that does not induce perpendicular magnetic anisotropy in the magnetization free layer 7.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

In the present embodiment, the perpendicular magnetization inducing layer 9 is disposed on a central region 7L in the in-plane direction (a direction along the XY plane) of the magnetization free layer 7. In the present embodiment, the leakage layer 11 is disposed on an end portion region 7E in the in-plane direction of the magnetization free layer 7.

The perpendicular magnetization inducing layer 9 is formed, for example, of MgO, ZnO, GaO$_X$, or an oxide material that has a spinel structure represented by general formula AB$_2$O$_4$ (in the formula, A is at least one kind of element selected from a group consisting of Mg and Zn, and B is at least one kind of element selected from a group consisting of Al, Ga, and In).

The perpendicular magnetization inducing layer 9 is preferably configured such that the resistance value of the perpendicular magnetization inducing layer 9 along the Z-axis direction per unit area in the XY plane is smaller than that of the tunnel barrier layer 5. Particularly, when the perpendicular magnetization inducing layer 9 is formed of an insulation material, the thickness in the Z-axis direction of the perpendicular magnetization inducing layer 9 is preferably smaller than the thickness in the Z-axis direction of the tunnel barrier layer 5.

The perpendicular magnetization inducing layer 9 is formed of a material that induces magnetic anisotropy (perpendicular magnetic anisotropy) in the direction along the Z axis in a region of the magnetization free layer 7 in the vicinity of the interface between the magnetization free layer 7 and the perpendicular magnetization inducing layer 9 based on the spin-orbit interaction. Accordingly, the perpendicular magnetization inducing layer 9 imparts magnetic anisotropy in the direction (perpendicular direction) along the Z axis to the magnetization free layer 7 in cooperation with the tunnel barrier layer 5.

The thickness of the magnetization free layer 7 in the Z-axis direction is small enough such that the easy magnetization axis of the magnetization free layer 7 is stably set in the direction along the Z axis by the function of imparting magnetic anisotropy exhibited by the tunnel barrier layer 5 and the perpendicular magnetization inducing layer 9 as described above. The thickness can be, for example, greater than or equal to 1 nm and less than or equal to 3 nm.

The leakage layer 11 is configured such that the resistance value of the leakage layer 11 along the Z-axis direction per unit area in the XY plane is smaller than that of the perpendicular magnetization inducing layer 9. The leakage layer 11 is formed, for example, of a conductive material such as a metal. In the present embodiment, while the leakage layer 11 is disposed on the whole end portion region 7E in the in-plane direction of the magnetization free layer 7, that is, on the whole periphery of the outer peripheral region of the magnetization free layer 7 when seen from the Z-axis direction, the leakage layer 11 may be disposed on only a part of the outer peripheral region of the magnetization free layer 7. In addition, the leakage layer 11 may be formed of the same material as the mask layer 15. In addition, in the present embodiment, while the leakage layer 11 is disposed on only the upper surface of the end portion region 7E of the magnetization free layer 7 as illustrated in FIG. 4, the leakage layer 11 may be disposed on only the side surface of the end portion region 7E, or may be disposed on both the upper surface and the side surface of the end portion region 7E. When the leakage layer 11 is disposed on only the side surface of the end portion region 7E, the perpendicular magnetization inducing layer 9 is preferably disposed on the whole upper surface of the magnetization free layer 7.

The mask layer 15 is stacked on the perpendicular magnetization inducing layer 9 and the leakage layer 11. The mask layer 15 is formed of a conductive material, for example, formed of a metal such as Ta, Ru, W, TaN, TiN, or CuN. The upper surface of the mask layer 15, which is the other end of the TMR element 1 of the present embodiment, is electrically connected to the bit line BL (refer to FIG. 3).

The side wall portion 17 is formed of an insulation material and covers the side surface of the stack portion ST. Accordingly, the side wall portion 17 electrically insulates the stack portion ST of the TMR element 1 from the stack portions of the other TMR elements. In the present embodiment, while the side wall portion 17 is in contact with the side surfaces of all of the reference layer 3, the tunnel barrier layer 5, the magnetization free layer 7, the leakage layer 11, and the mask layer 15, the side wall portion 17 may not be in contact with a part of the side surfaces thereof. In addition, when the leakage layer 11 is disposed on only a part of the outer peripheral region of the magnetization free layer 7, the side wall portion 17 may be in contact with a part of the side surface of the perpendicular magnetization inducing layer 9. The side wall portion 17 is formed, for example, of a nitride material such as SiN, or an oxynitride material such as SiON.

As described above, since the easy magnetization axis of the magnetization free layer 7 is set in the direction along the Z axis, and the magnetization direction of the reference layer 3 is substantially fixed in the direction along the Z-axis direction, the magnetization direction of the reference layer 3 is parallel or antiparallel to the magnetization direction of the magnetization free layer 7 when the magnetization free layer 7 is not substantially affected by an external magnetic field or an SIT. The stack portion ST in a state where the magnetization directions of the reference layer 3 and the magnetization free layer 7 are parallel to each other has a different electrical resistance value in the Z-axis direction from that of the stack portion ST in a state where the magnetization directions of the reference layer 3 and the magnetization free layer 7 are antiparallel to each other. Thus, these two states respectively correspond to "1" and "0" that are data of the memory cell of the MRAM 100.

The magnetization direction of the magnetization free layer 7 is reversed (that is, data is written into the memory cell in the MRAM 100) by spin injection magnetization reversal. Specifically, when the magnetization direction of the magnetization free layer 7 is reversed to a parallel state from an antiparallel state with respect to the magnetization direction of the reference layer 3, a voltage is applied between one end and the other end in the Z-axis direction of the stack portion ST such that the tunnel current flows through the tunnel barrier layer 5 in a direction from the magnetization free layer 7 toward the reference layer 3 (that is, spin-polarized electrons move toward the magnetization free layer 7 from the reference layer 3). Accordingly, from the spin-polarized electrons, the magnetization free layer 7 receives a spin transfer torque in a direction in which the magnetization direction of the magnetization free layer 7 rotates toward a parallel state from an antiparallel state with respect to the magnetization direction of the reference layer 3. The magnetization direction of the magnetization free layer 7 is reversed by setting the magnitude of the voltage to be higher than or equal to the threshold that causes spin injection magnetization reversal.

Conversely, when the magnetization direction of the magnetization free layer 7 is reversed to an antiparallel state from a parallel state with respect to the magnetization direction of the reference layer 3, a voltage is applied between one end and the other end in the Z-axis direction of the stack portion ST such that the tunnel current flows through the tunnel barrier layer 5 in a direction from the reference layer 3 toward the magnetization free layer 7 (that is, spin-polarized electrons move toward the reference layer 3 from the magnetization free layer 7). Accordingly, from the spin-polarized electrons, the magnetization free layer 7 receives a spin transfer torque in a direction in which the magnetization direction of the magnetization free layer 7 rotates toward an antiparallel state from a parallel state with respect to the magnetization direction of the reference layer 3. The magnetization direction of the magnetization free layer 7 is reversed by setting the magnitude of the voltage to be higher than or equal to the threshold that causes spin injection magnetization reversal.

In the TMR element 1 according to the present embodiment, the leakage layer 11 of which the resistance value in the stack direction per unit area in plane is smaller than that of the perpendicular magnetization inducing layer 9 is disposed on the end portion region 7E in the in-plane direction of the magnetization free layer 7 (refer to FIG. 4). Thus, when the magnetization direction of the magnetization free layer 7 is reversed by spin injection magnetization reversal, a spin-polarized current can flow through the magnetization free layer 7 via not only the perpendicular magnetization inducing layer 9 but also the leakage layer 11. A part of the spin-polarized current that flows through the end portion region 7E of the magnetization free layer 7 via the leakage layer 11 flows through the end portion region 7E in the in-plane direction, and thus, induces drive of magnetic domain walls in the end portion region 7E. In addition, in the end portion region 7E that is close to the leakage layer 11, the amount of spin-polarized current that flows via the tunnel barrier layer 5 is increased. Thus, magnetization is easily reversed. Accordingly, the reversal of the magnetization of the end portion region 7E where the magnetization direction is particularly not easily reversed in the magnetization free layer 7 is promoted by the induced drive of the magnetic domain walls. Thus, according to the TMR element 1 according to the present embodiment, the amount of reversal current can be reduced.

Furthermore, in the TMR element 1 according to the present embodiment, the leakage layer 11 is preferably formed of a metal that includes at least one of W, Ta, Mo, Nb, and Ru. Accordingly, since W, Ta, Mo, Nb, and Ru are metals that have high thermal resistance, melting of the leakage layer 11 and the occurrence of migration of the metal constituting the leakage layer 11 can be suppressed even when a large amount of current flows through the leakage layer 11 at the time of spin injection magnetization reversal.

Furthermore, in the TMR element 1 according to the present embodiment, the width in the in-plane direction of the leakage layer 11 (in FIG. 4, the width in the X-axis direction) is preferably greater than the thickness in the Z-axis direction of the perpendicular magnetization inducing layer 9 in a cross section parallel to the Z-axis direction (for example, the cross section illustrated in FIG. 4). Accordingly, since a sufficiently large amount of spin-polarized current can flow through the leakage layer 11 at the time of spin injection magnetization reversal, the amount of reversal current can be particularly reduced.

Furthermore, in the TMR element 1 according to the present embodiment, it is preferable that at least one of the tunnel barrier layer 5 and the perpendicular magnetization inducing layer 9 is formed of an oxide material and the side wall portion 17 is formed of a nitride material. Accordingly, since the side wall portion 17 is formed of a nitride material, the movement of the oxygen atoms of the tunnel barrier layer 5 and/or the perpendicular magnetization inducing layer 9 formed of an oxide material to the side wall portion 17 can be suppressed.

Furthermore, in the TMR element 1 according to the present embodiment, each of the tunnel barrier layer 5 and the perpendicular magnetization inducing layer 9 is preferably formed of MgO or an oxide material that has a spinel structure represented by general formula $AB_2O_4$ (in the formula, A is at least one kind of element selected from a group consisting of Mg and Zn, and B is at least one kind of element selected from a group consisting of Al, Ga, and In). Accordingly, since these materials can particularly effectively impart magnetic anisotropy along the Z-axis direction to the magnetization free layer 7, the direction of the easy magnetization axis of the magnetization free layer 7 can be particularly stably set in the perpendicular direction.

Furthermore, in the TMR element 1 according to the present embodiment, it is preferable that each of the tunnel barrier layer 5 and the perpendicular magnetization inducing layer 9 is formed of an oxide material that has a spinel structure represented by the above general formula $AB_2O_4$ and at least one of the A site or the B site of the spinel structure is occupied by a plurality of elements, and it is more preferable that each of the A site and the B site of the spinel structure is preferably occupied by a plurality of elements. Accordingly, a strain in the interface between the tunnel barrier layer 5 and the magnetization free layer 7, and a strain in the interface between the perpendicular magnetization inducing layer 9 and the magnetization free layer 7 can be easily suppressed. Furthermore, the resistance value of each of the tunnel barrier layer 5 and the perpendicular magnetization inducing layer 9 can be easily controlled.

Furthermore, the TMR element 1 according to the present embodiment further includes the mask layer 15 that is formed of a conductive material and is stacked on the perpendicular magnetization inducing layer 9 and the leakage layer 11 (refer to FIG. 4). Accordingly, the TMR element 1 having the above configuration can be easily manufactured using a manufacturing method that includes an etching step using the mask layer 15.

Two specific examples of a manufacturing method for such a TMR element of the present embodiment will be described. FIG. 5 to FIG. 19 are views illustrating a cross section for describing the first specific example of the manufacturing method for the TMR element of the present embodiment. Each of FIG. 5 to FIG. 19 corresponds to the cross section in the vicinity of the above TMR element 1 illustrated in FIG. 4.

Figure 5:
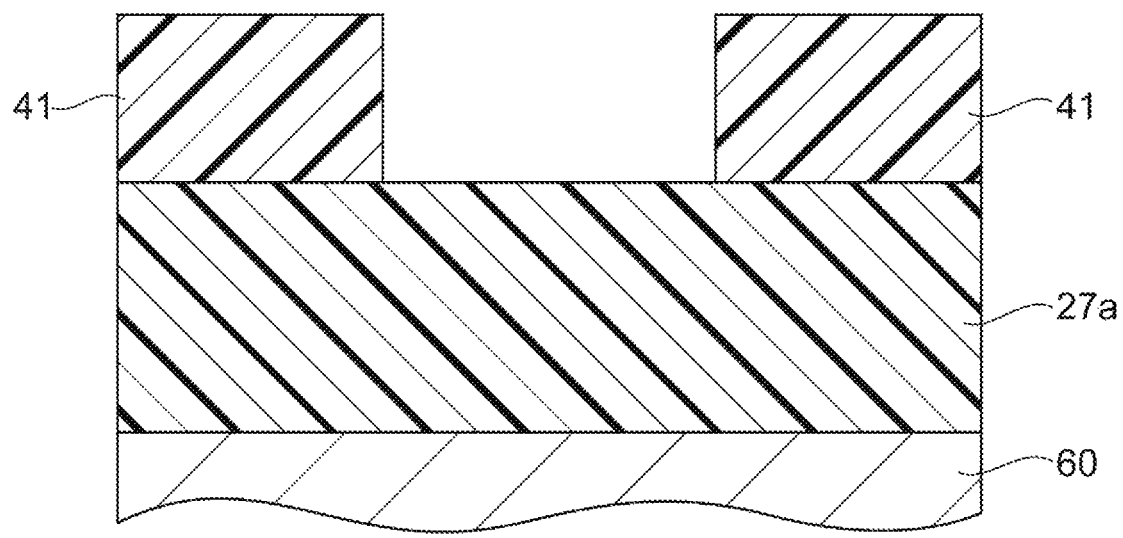
FIG. 5 is a view illustrating a cross-section for describing the first specific example of a manufacturing method for the TMR element.
Figure 5:
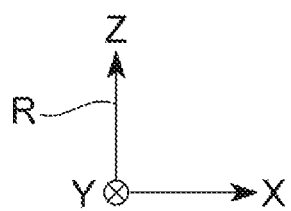

In the first specific example of the manufacturing method, first, as illustrated in FIG. 5, a lower interlayer insulation layer 27a is formed on the whole surface on the transistor array 60. Then, a resist 41 that has an opening is framed on the lower interlayer insulation layer 27a. The lower interlayer insulation layer 27a is formed of the same material as the interlayer insulation layer 27. The opening of the resist 41 corresponds to a region in which the via interconnect part 25 described later is formed.

Figure 6:
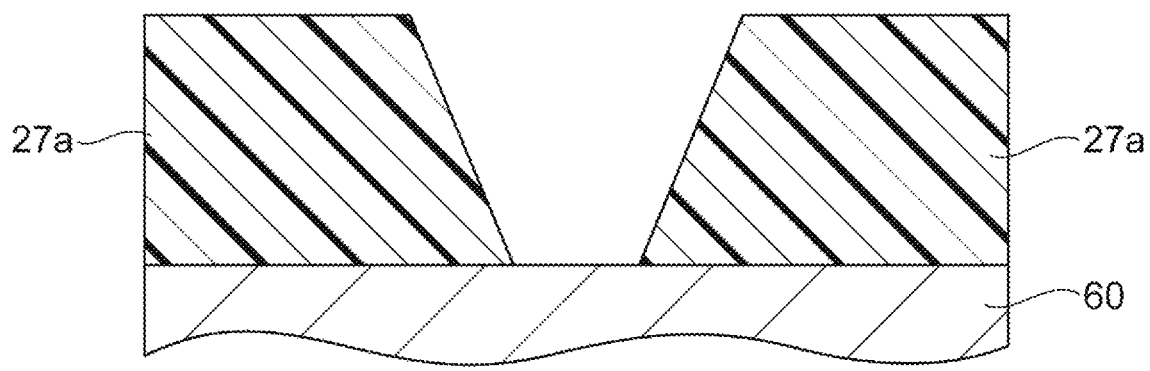
FIG. 6 is a view illustrating a cross-section for describing the first specific example of the manufacturing method for the TMR element.
Figure 6:
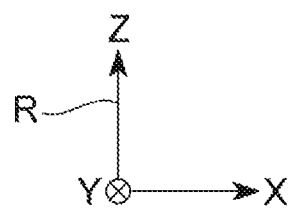

Next, as illustrated in FIG. 6, the lower interlayer insulation layer 27a is etched by dry etching such as reactive ion etching (RIE) using the resist 41 as a mask. Then, an opening that has a depth reaching the transistor array 60 is formed in the lower interlayer insulation layer 27a by removing the resist 41.

Figure 7:
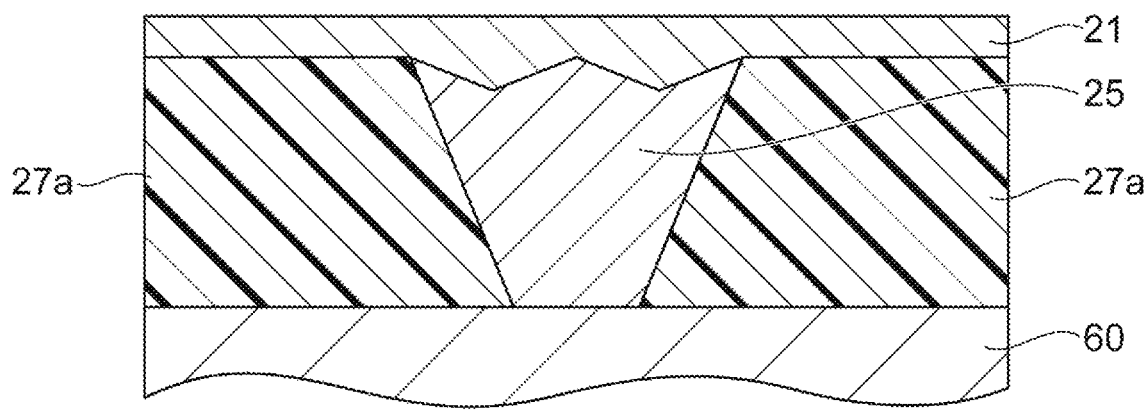
FIG. 7 is a view illustrating a cross-section for describing the first specific example of the manufacturing method for the TMR element.
Figure 7:
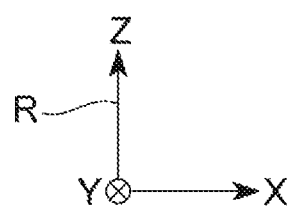

Next, as illustrated in FIG. 7, the via interconnect part 25 that is formed of a metal such as Cu is formed such that the opening of the lower interlayer insulation layer 27a is embedded. Then, the base layer 21 that is formed of a conductive material is formed on the via interconnect part 25 and the lower interlayer insulation layer 27a. A base layer that is formed of a conductive material such as Ta may be formed on the side surface of the opening of the lower interlayer insulation layer 27a before the via interconnect part 25 is formed.

Figure 8:
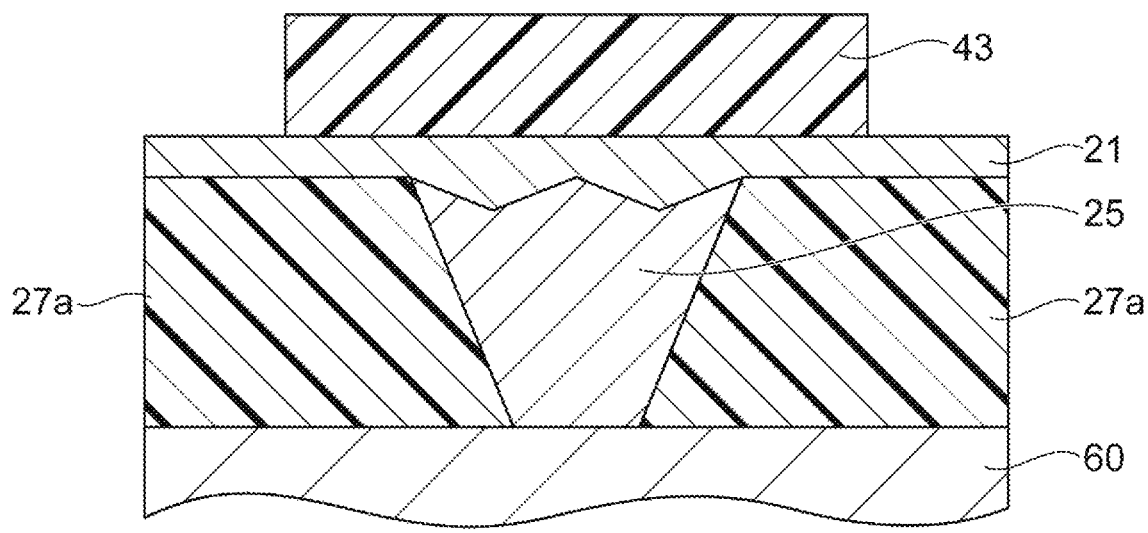
FIG. 8 is a view illustrating a cross-section for describing the first specific example of the manufacturing method for the TMR element.
Figure 8:
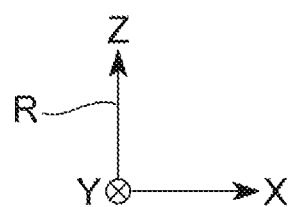

Next, as illustrated in FIG. 8, a resist 43 is formed on the base layer 21. The resist 43 is formed at a position that is above the whole via interconnect part 25 and a part of the lower interlayer insulation layer 27a in the perpendicular direction, and is not formed at a position that is above, in the perpendicular direction, a region in which an upper interlayer insulation layer 27b described later is formed.

Figure 9:
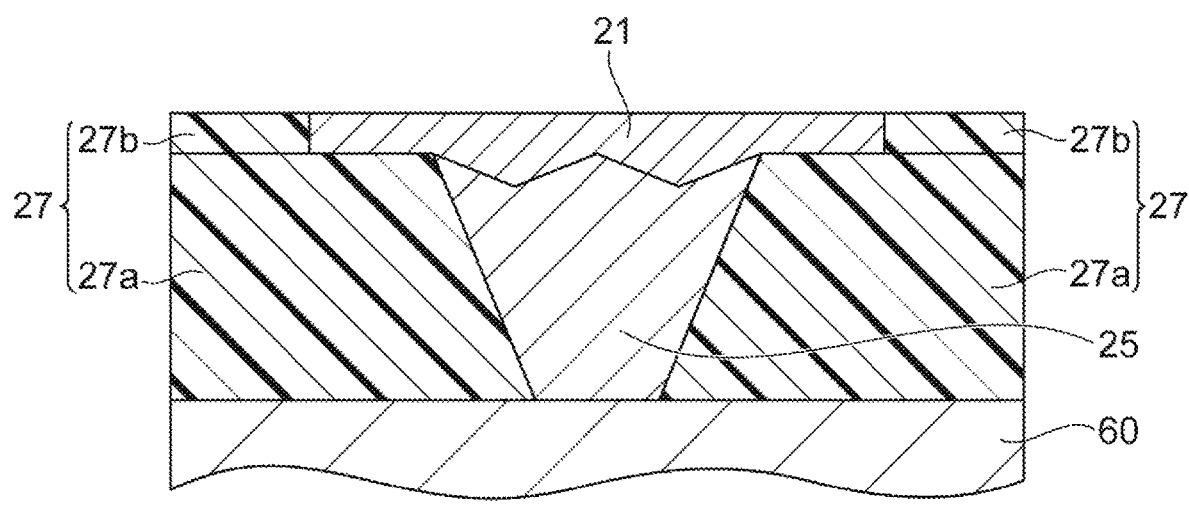
FIG. 9 is a view illustrating a cross-section for describing the first specific example of the manufacturing method for the TMR element.
Figure 9:
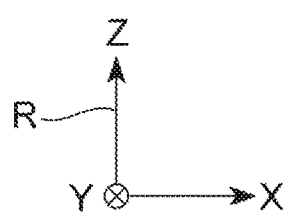

Next, as illustrated in FIG. 9, the base layer 21 is selectively etched by dry etching such as RIE using the resist 43 as a mask. Then, the upper interlayer insulation layer 27b is formed in the etched region. Then, the resist 43 is removed. Then, the surface of each of the base layer 21 and the upper interlayer insulation layer 27b is flattened by polishing such as chemical mechanical polishing (CMP). Accordingly, the flatness of the upper surface of the base layer 21 is higher than the flatness of the upper surface of the via interconnect part 25. The upper interlayer insulation layer 27b is formed of the same material as the interlayer insulation layer 27. The lower interlayer insulation layer 27a and the upper interlayer insulation layer 27b constitute the interlayer insulation layer 27.

Figure 10:
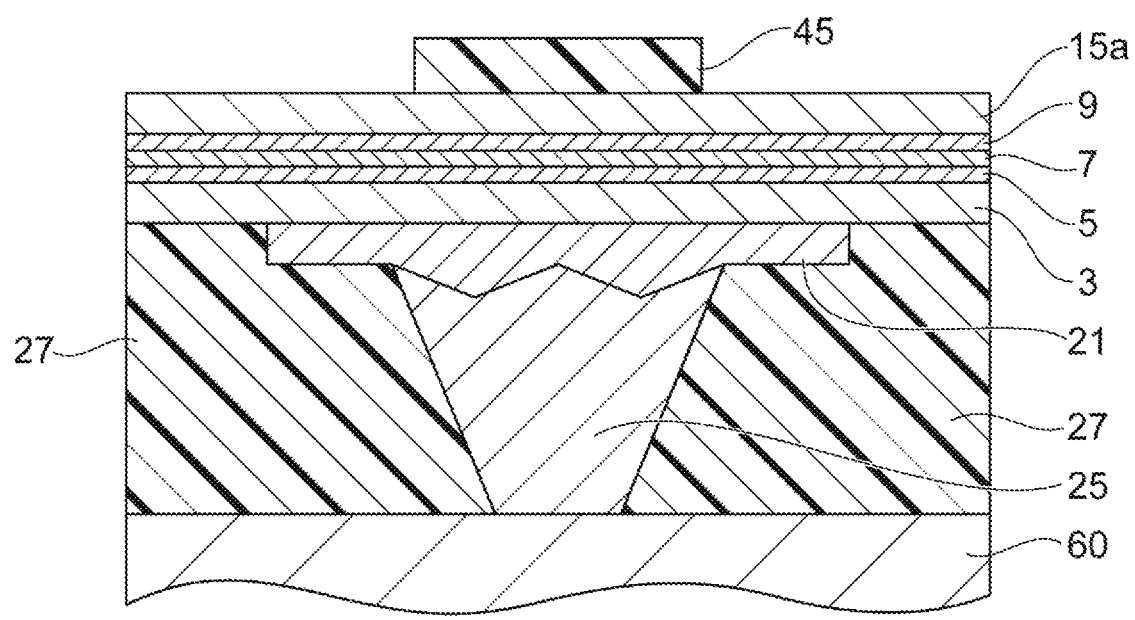
FIG. 10 is a view illustrating a cross-section for describing the first specific example of the manufacturing method for the TMR element.
Figure 10:
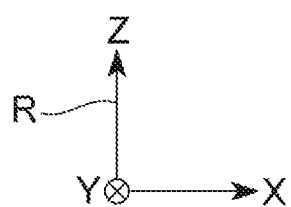

Next, as illustrated in FIG. 10, the reference layer 3, the tunnel barrier layer 5, the magnetization free layer 7, the perpendicular magnetization inducing layer 9, and a lower mask layer 15a are formed in this order on the whole surface on the base layer 21 and the interlayer insulation layer 27. Then, a resist 45 is formed on a part of the surface of the lower mask layer 15a. The resist 45 is formed at a position that is above the via interconnect part 25 in the perpendicular direction and above a part of the base layer 21 in the perpendicular direction. The lower mask layer 15a is formed of the same material as the mask layer 15.

Figure 11:
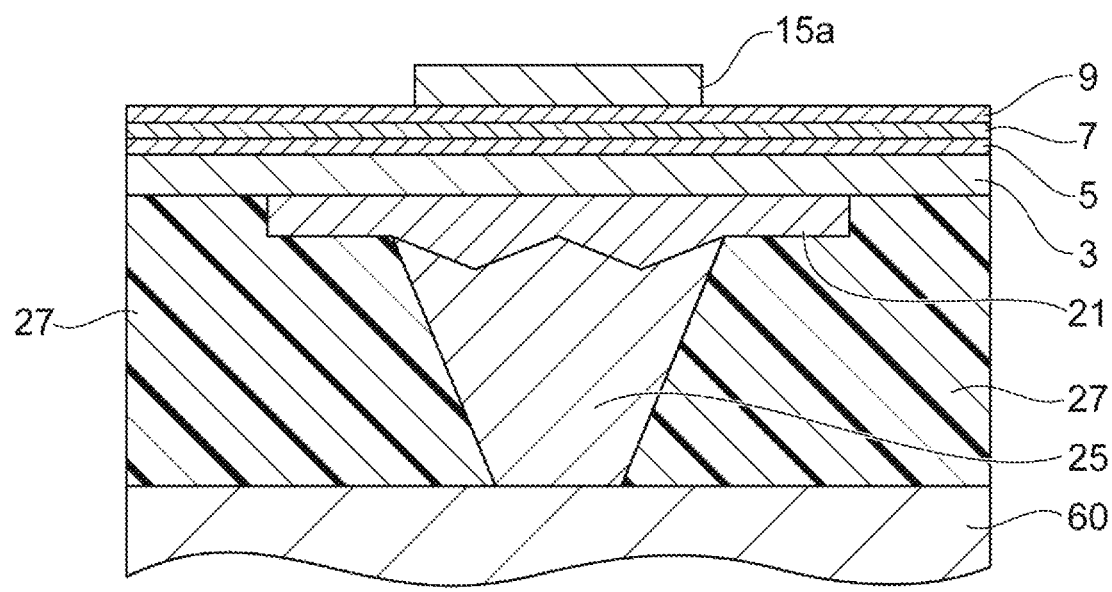
FIG. 11 is a view illustrating a cross-section for describing the first specific example of the manufacturing method for the TMR element.
Figure 11:
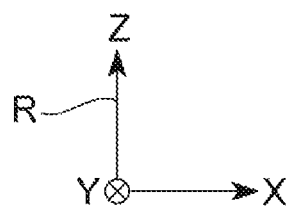
Figure 12:
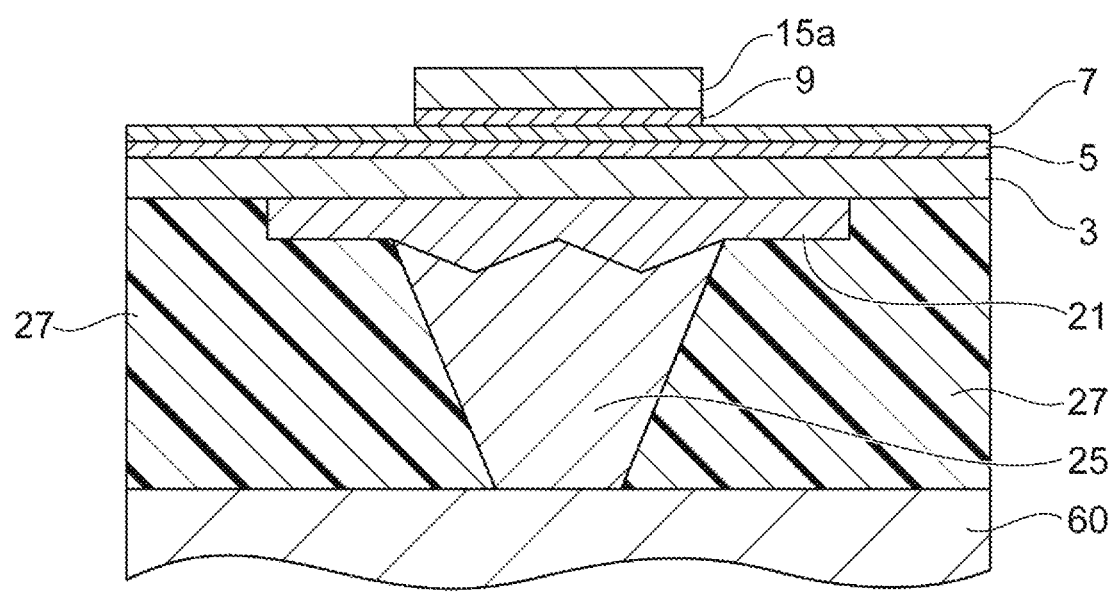
FIG. 12 is a view illustrating a cross-section for describing the first specific example of the manufacturing method for the TMR element.

Next, as illustrated in FIG. 11, the lower mask layer 15a is selectively etched by dry etching such as RIE using the resist 45 as a mask such that a part of the upper surface of the perpendicular magnetization inducing layer 9 is exposed. Then, the resist 45 is removed. By doing so, the lower mask layer 15a that has a shape covering a part of each of the base layer 21, the reference layer 3, the tunnel barrier layer 5, the magnetization free layer 7, and the perpendicular magnetization inducing layer 9 is formed at a position that is above the via interconnect part 25 in the perpendicular direction. Next, as illustrated in FIG. 12, the perpendicular magnetization inducing layer 9 is selectively etched by dry etching such as RIE using the lower mask layer 15a as a mask such that a part of the upper surface of the magnetization free layer 7 and the side surface of the perpendicular magnetization inducing layer 9 are exposed.

Figure 13:
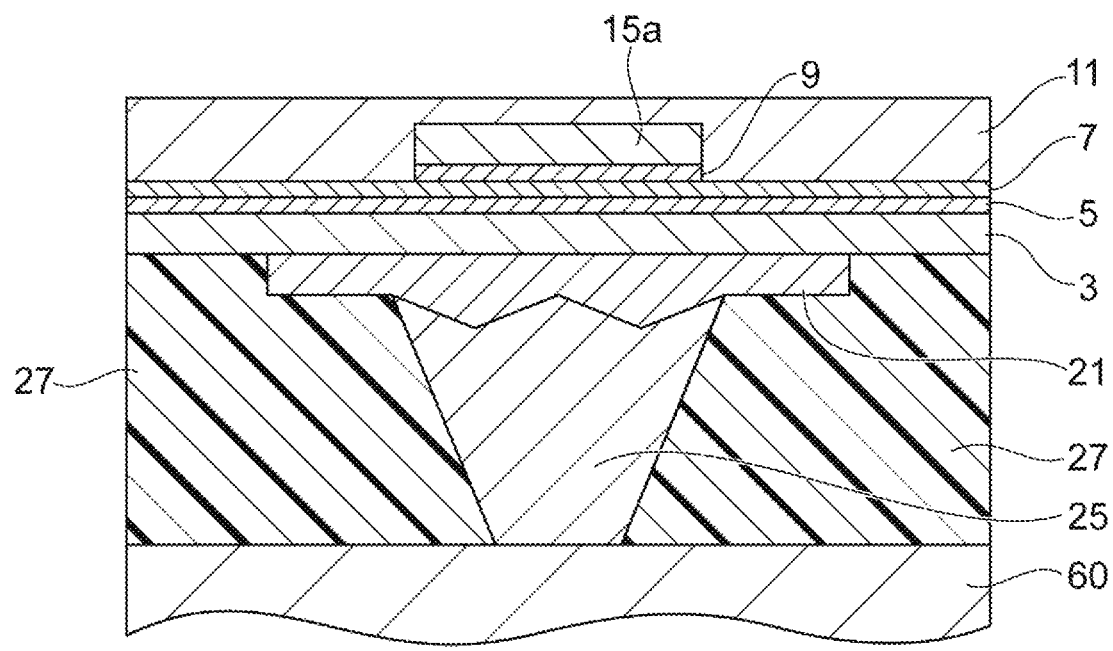
FIG. 13 is a view illustrating a cross-section for describing the first specific example of the manufacturing method for the TMR element.

Next, as illustrated in FIG. 13, the leakage layer 11 is formed on the magnetization free layer 7, the perpendicular magnetization inducing layer 9, and the lower mask layer 15a such that the perpendicular magnetization inducing layer 9 and the lower mask layer 15a are embedded.

Figure 14:
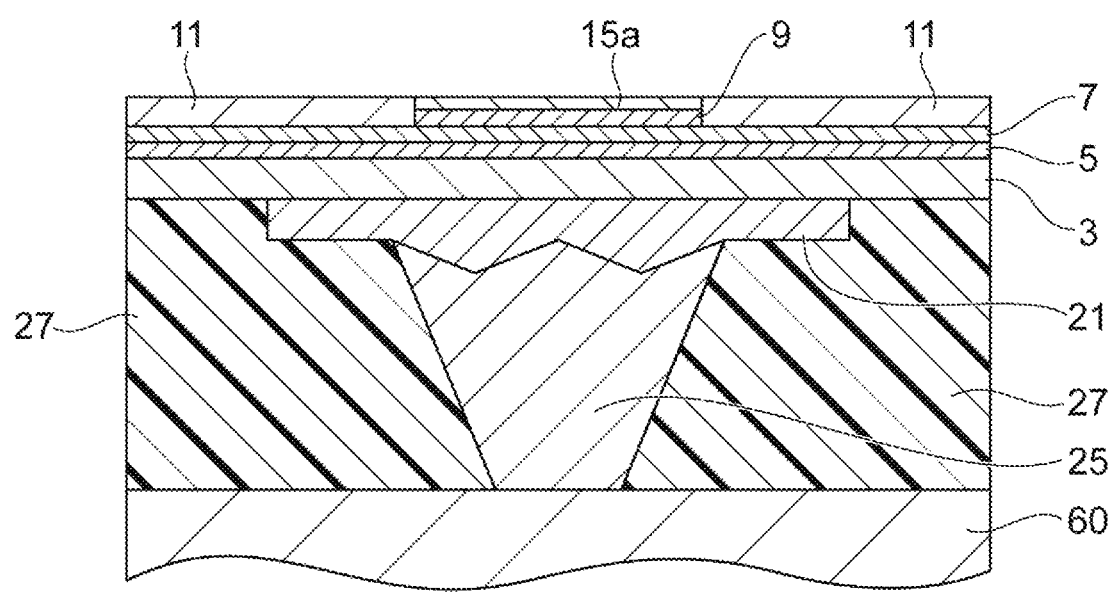
FIG. 14 is a view illustrating a cross-section for describing the first specific example of the manufacturing method for the TMR element.
Figure 14:
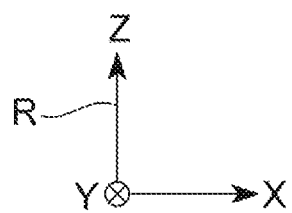

Next, as illustrated in FIG. 14, the leakage layer 11 and the lower mask layer 15a are thinned by polishing such as CMP or the like. Accordingly, the leakage layer 11 is thinned to have a final necessary thickness. In the present example of the manufacturing method, while a part of the lower mask layer 15a remains after the present step, the lower mask layer 15a may be completely removed.

Figure 15:
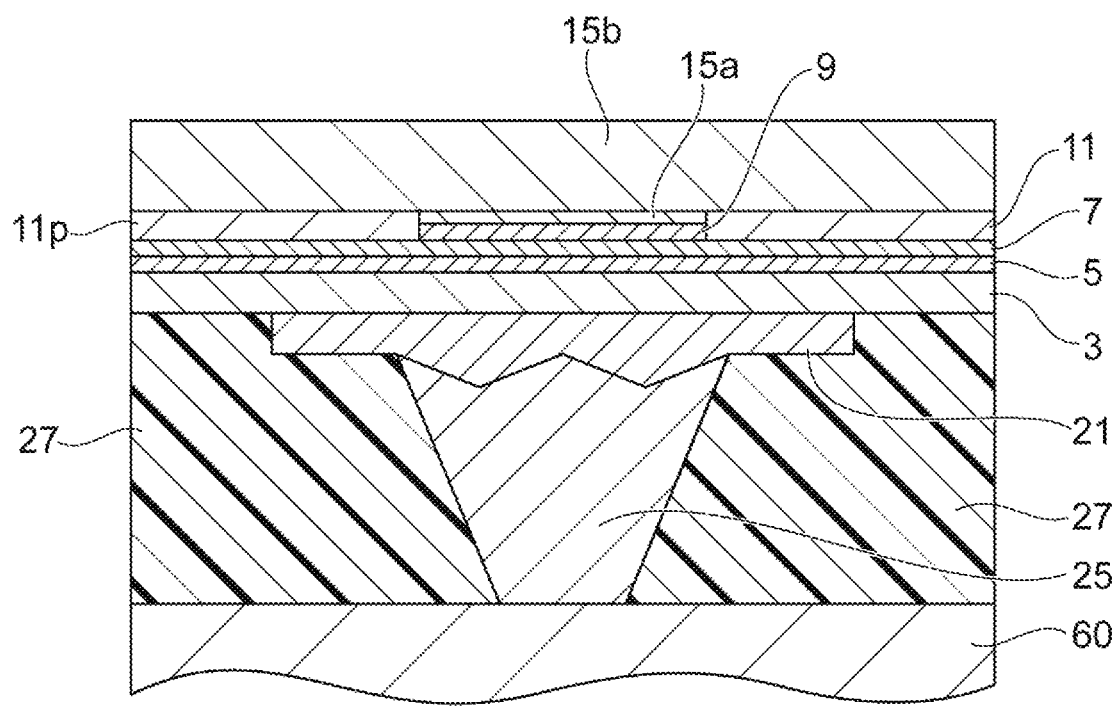
FIG. 15 is a view illustrating a cross-section for describing the first specific example of the manufacturing method for the TMR element.
Figure 15:
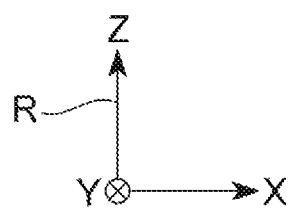

Next, as illustrated in FIG. 15, an upper mask layer 15b is formed on the whole upper surfaces of the leakage layer 11 and the lower mask layer 15a. The upper mask layer 15b is fixated of the same material as the mask layer 15.

Figure 16:
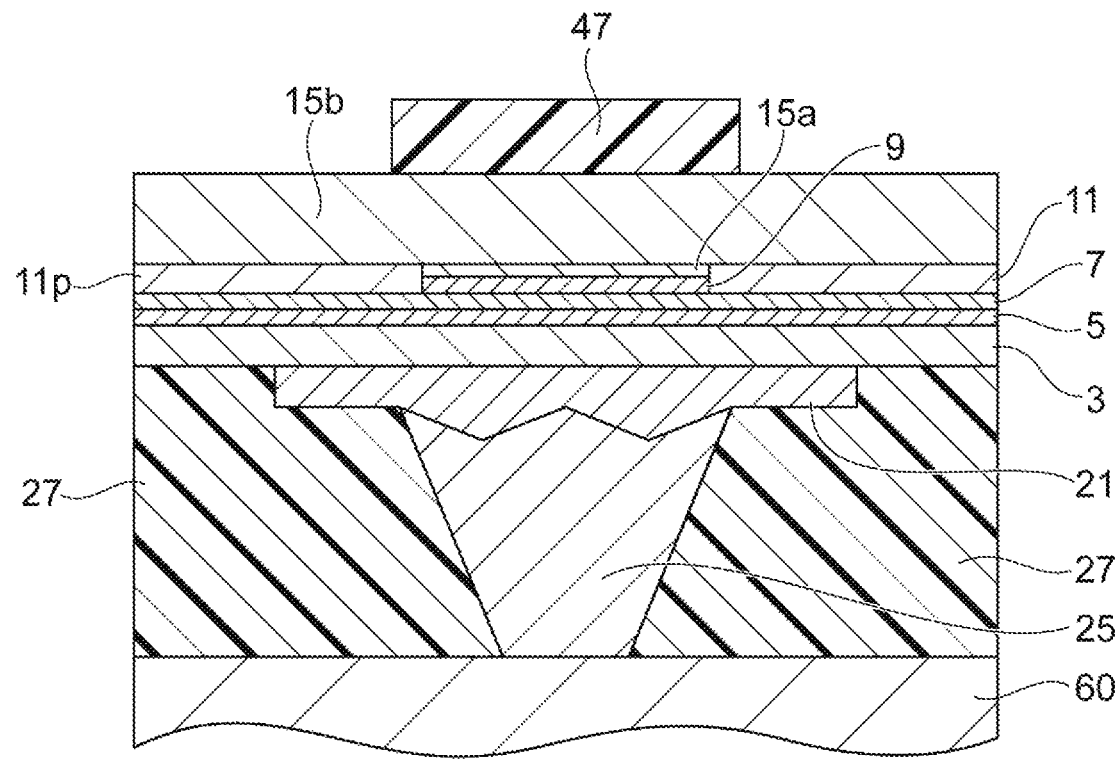
FIG. 16 is a view illustrating a cross-section for describing the first specific example of the manufacturing method for the TMR element.
Figure 16:
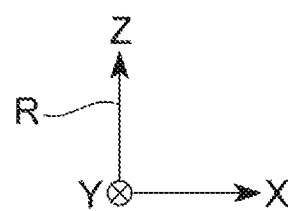

Next, as illustrated in FIG. 16, a resist 47 is formed on the upper mask layer 15b. The resist 47 is formed at a position that is above the perpendicular magnetization inducing layer 9 and a region of the leakage layer 11 adjacent to the perpendicular magnetization inducing layer 9 in the perpendicular direction.

Next, as illustrated in FIG. 17, the upper mask layer 15b and the leakage layer 11 are selectively etched by dry etching such as RIE using the resist 47 as a mask. Then, the resist 47 is removed. Accordingly, the leakage layer 11 is defined to have a shape that is adjacent to the side surface of the perpendicular magnetization inducing layer 9 between the upper mask layer 15b and the magnetization free layer 7. The lower mask layer 15a and the upper mask layer 15b constitute the mask layer 15.

Figure 18:
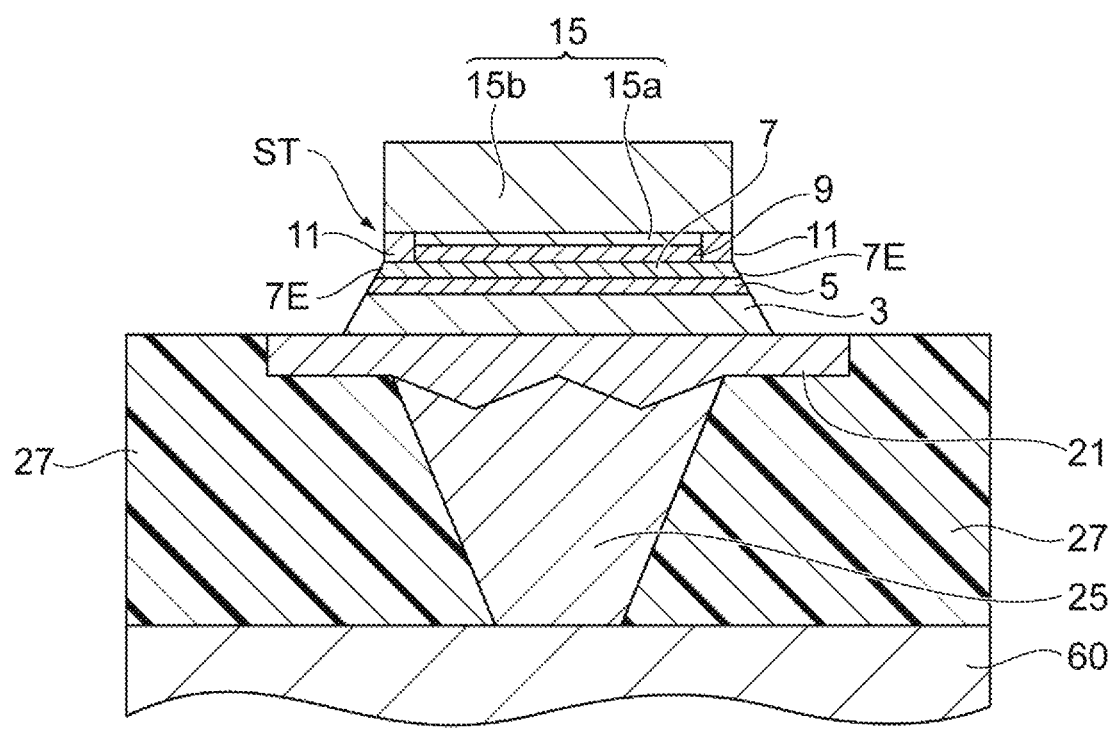
FIG. 18 is a view illustrating a cross-section for describing the first specific example of the manufacturing method for the TMR element.
Figure 18:
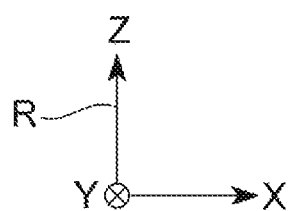

Next, as illustrated in FIG. 18, the magnetization free layer 7, the tunnel barrier layer 5, and the reference layer 3 are etched by dry etching such as RIE using the mask layer 15 as a mask. Accordingly, the stack portion ST of the TMR element is formed to have a final shape.

Figure 19:
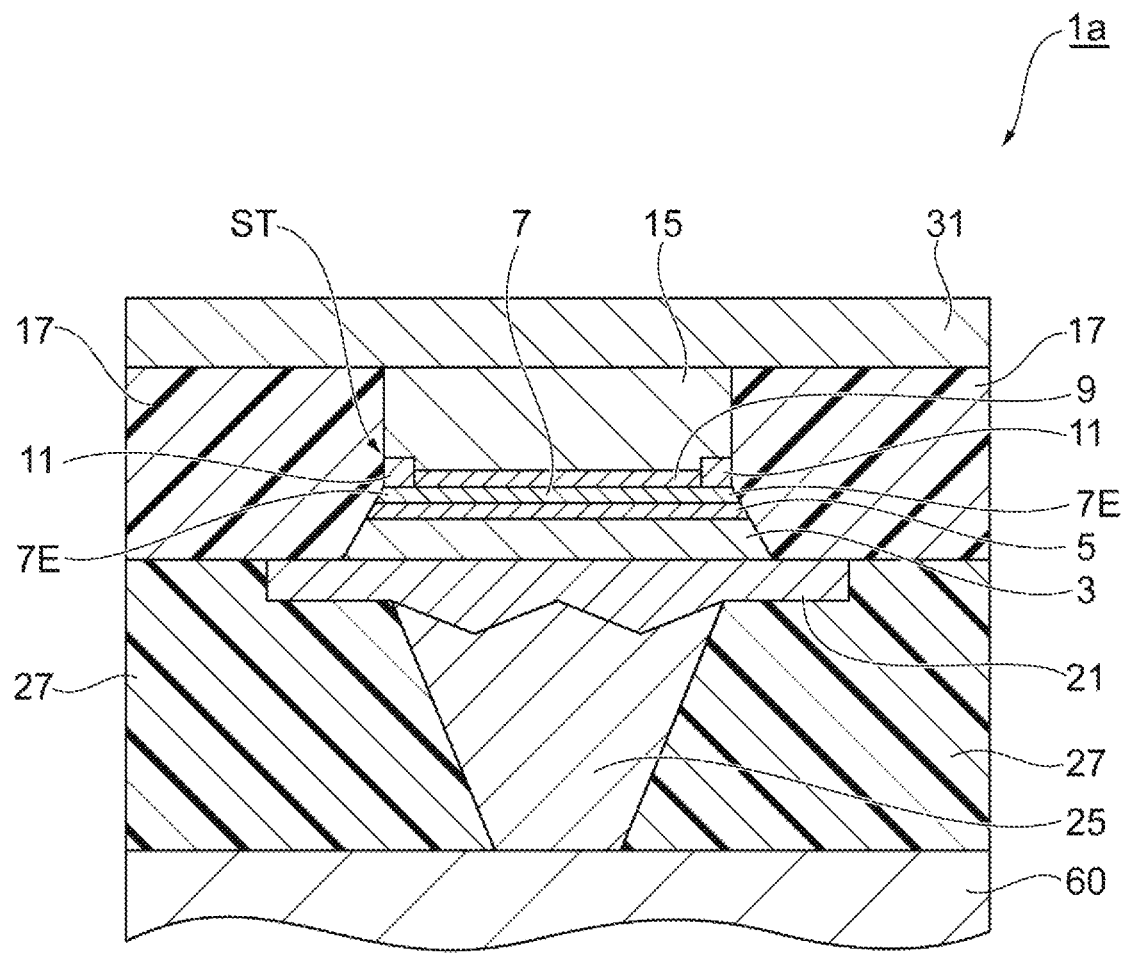
FIG. 19 is a view illustrating a cross-section for describing the first specific example of the manufacturing method for the TMR element.

Next, as illustrated in FIG. 19, a TMR element 1a is completed by forming the side wall portion 17 on the base layer 21 and the interlayer insulation layer 27 such that the stack portion ST is embedded, and forming an upper electrode layer' 31 on the mask layer 15 and the side wall portion 17. In the TMR element 31a acquired in the present example of the manufacturing method, the leakage layer 11 is in contact with the magnetization free layer 7 on only the upper surface in the end portion region 7E of the magnetization free layer 7.

Next, a second specific example of the manufacturing method for the TMR element of the present embodiment will be described. FIG. 20 to FIG. 24 are views illustrating a cross section for describing the second specific example of the manufacturing method for the TMR element of the present embodiment. Each of FIG. 20 to FIG. 24 corresponds to the cross section in the vicinity of the above TMR element 1 illustrated in FIG. 4.

In the second specific example of the manufacturing method, first, the via interconnect part 25, the interlayer insulation layer 27, and the base layer 21 are formed on the transistor array 60 by the same steps as the steps of the first specific example of the manufacturing method illustrated in FIG. 5 to FIG. 9.

Figure 20:
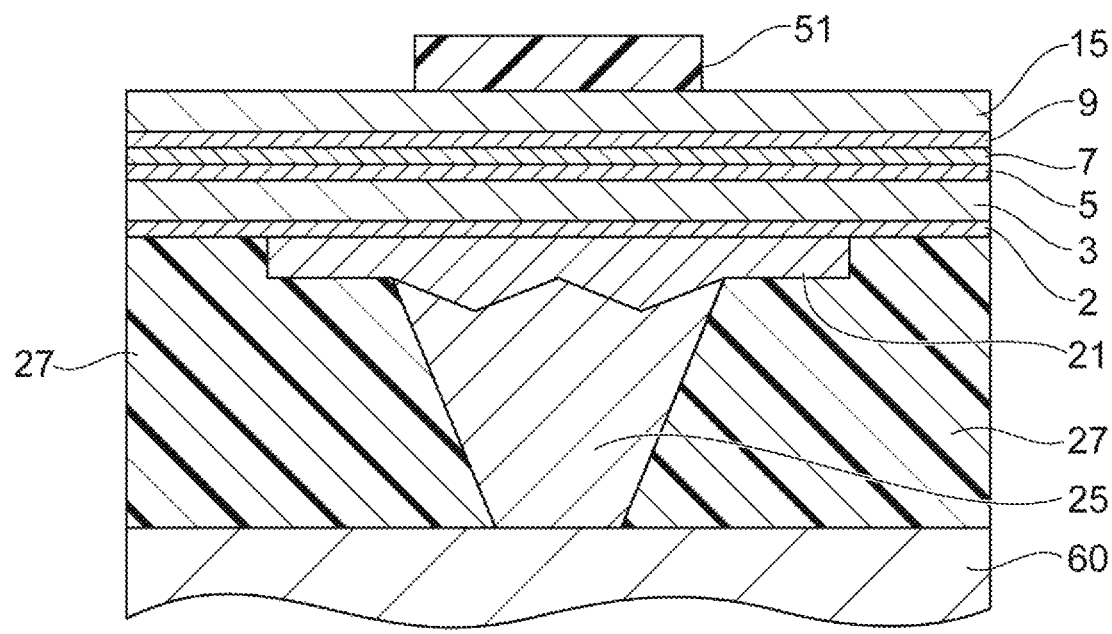
FIG. 20 is a view illustrating a cross-section for describing the second specific example of the manufacturing method for the TMR element.

Next, as illustrated in FIG. 20, a seed layer 2, the reference layer 3, the tunnel barrier layer 5, the magnetization free layer 7, the perpendicular magnetization inducing layer 9, and the mask layer 15 are formed in this order on the whole surface on the base layer 21 and the interlayer insulation layer 27. The seed layer 2 is formed of a conductive material such as Ta. Then, a resist 51 is formed on a part of the surface of the mask layer 15. The resist 51 is formed at a position that is above the via interconnect part 25 in the perpendicular direction and above a part of the base layer 21 in the perpendicular direction.

Figure 21:
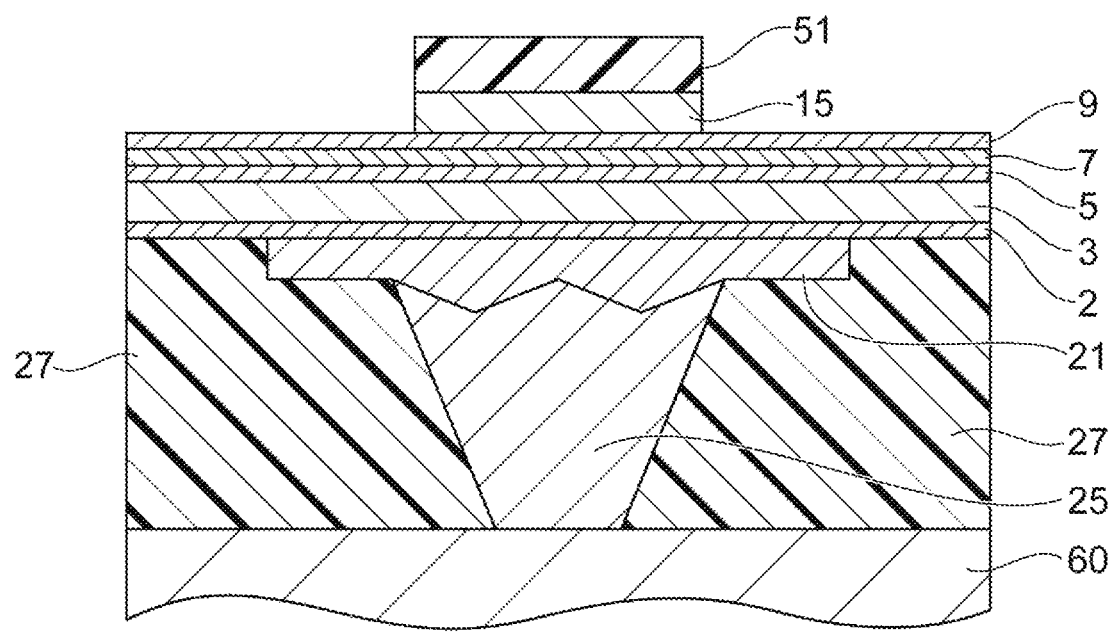
FIG. 21 is a view illustrating a cross-section for describing the second specific example of the manufacturing method for the TMR element.
Figure 21:
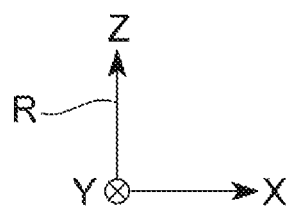

Next, as illustrated in FIG. 21, the mask layer 15 is selectively etched by dry etching such as RIE using the resist 51 as a mask such that the surface of the perpendicular magnetization inducing layer 9 is exposed.

Figure 22:
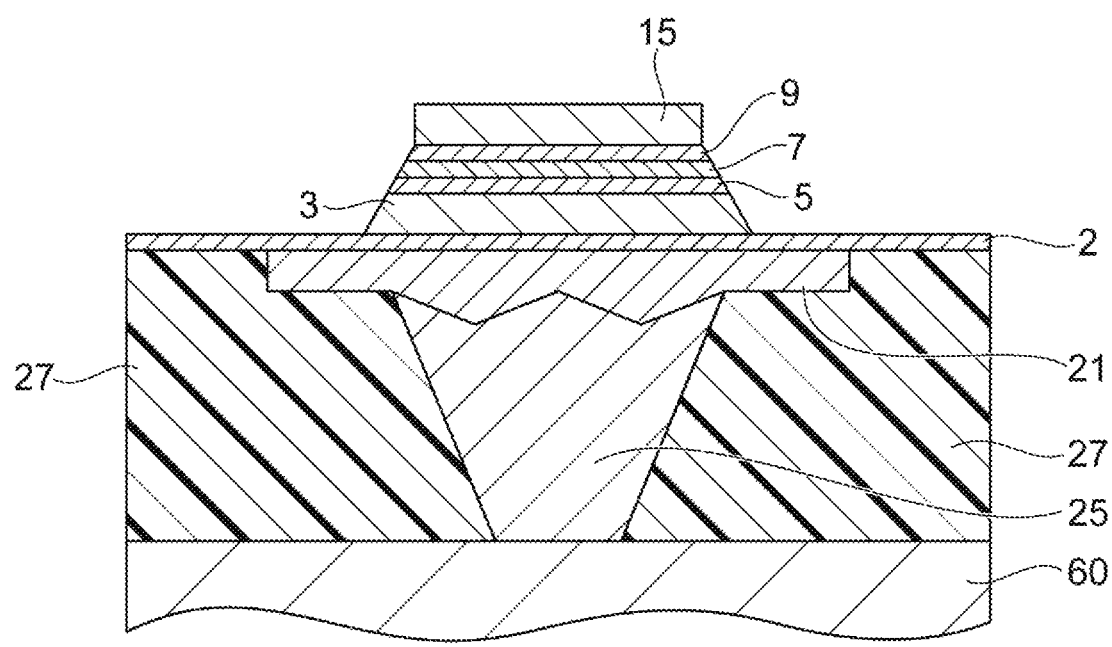
FIG. 22 is a view illustrating a cross-section for describing the second specific example of the manufacturing method for the TMR element.
Figure 22:
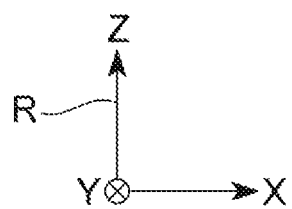

Next, as illustrated in FIG. 22, the resist 51 is removed. Then, the perpendicular magnetization inducing layer 9, the magnetization free layer 7, the tunnel barrier layer 5, and the reference layer 3 are etched by dry etching such as RIE using the mask layer 15 as a mask. The etching is stopped when the seed layer 2 is exposed.

Figure 23:
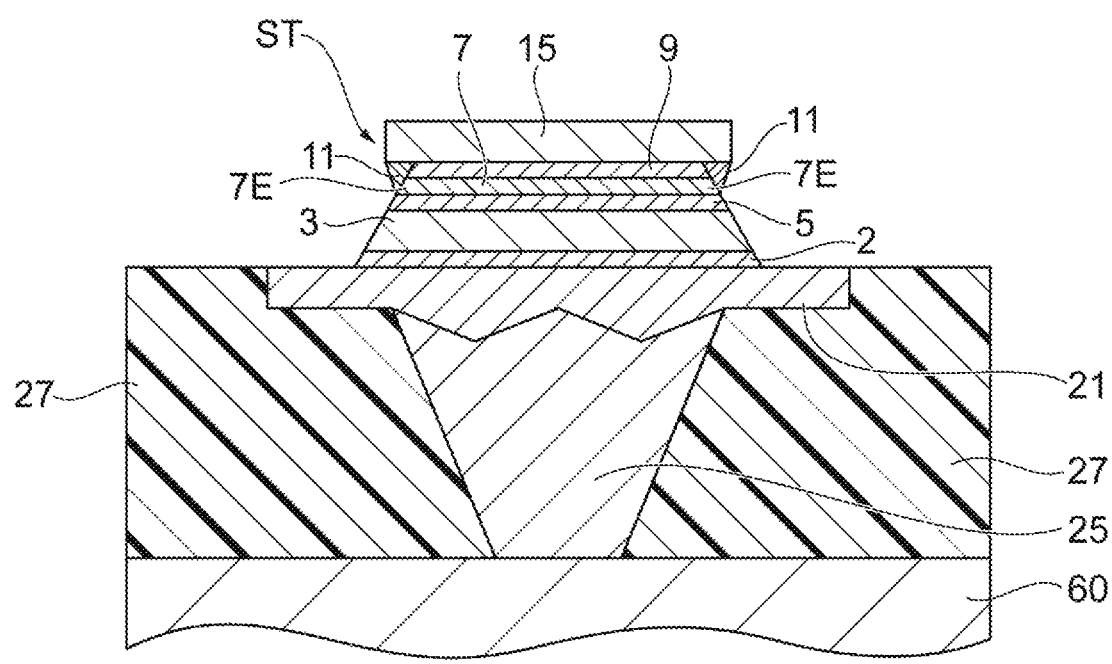
FIG. 23 is a view illustrating a cross-section for describing the second specific example of the manufacturing method for the TMR element.
Figure 23:
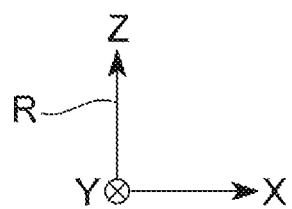

Next, as illustrated in FIG. 23, an irradiation angle for an ion beam is set in a direction that forms an acute angle (for example, 40 degrees to 80 degrees) with -Z-axis direction. Then, the side surfaces of the layers from the mask layer 15 to the reference layer 3, and the seed layer 2 are etched by ion milling. At this time, the milling rate for the layers from the perpendicular magnetization inducing layer 9 to the reference layer 3 is higher than the milling rate for the mask layer 15. Thus, since the side surfaces of the layers from the perpendicular magnetization inducing layer 9 to the reference layer 3 are etched more than the side surface of the mask layer 15, the mask layer 15 has a hat shape with respect to the structure from the perpendicular magnetization inducing layer 9 to the reference layer 3. Thus, a part of the etched materials of the layers from the perpendicular magnetization inducing layer 9 to the seed layer 2 adheres between the lower surface of the mask layer 15 and the side surfaces of the perpendicular magnetization inducing layer 9 and the leakage layer 11, and forms the leakage layer 11. The leakage layer 11 mainly includes the material of the seed layer 2 and may further include the materials of the layers from the perpendicular magnetization inducing layer 9 to the reference layer 3. By the present step, the stack portion ST of the TMR element is formed to have a final shape.

Figure 24:
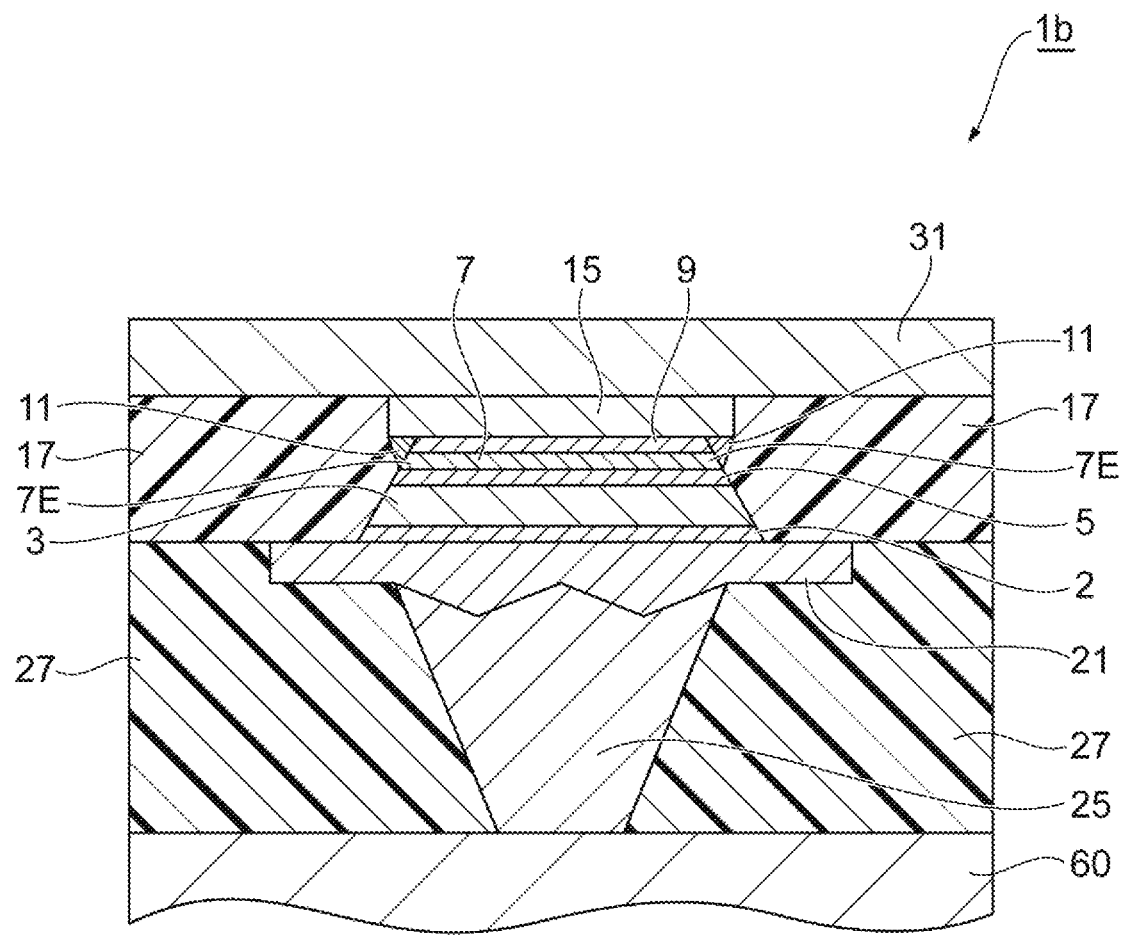
FIG. 24 is a view illustrating a cross-section for describing the second specific example of the manufacturing method for the TMR element.
Figure 24:
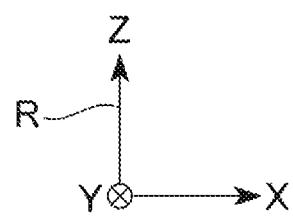

Next, as illustrated in FIG. 24, a TMR element 1b is completed by forming the side wall portion 17 on the base layer 21 and the interlayer insulation layer 27 such that the stack portion ST is embedded, and forming an upper electrode layer 31 on the mask layer 15 and the side wall portion 17. In the TMR element 1b acquired in the present manufacturing method, the leakage layer 11 is in contact with the magnetization free layer 7 on only the side surface in the end portion region 7E of the magnetization free layer 7.

Figure 25:
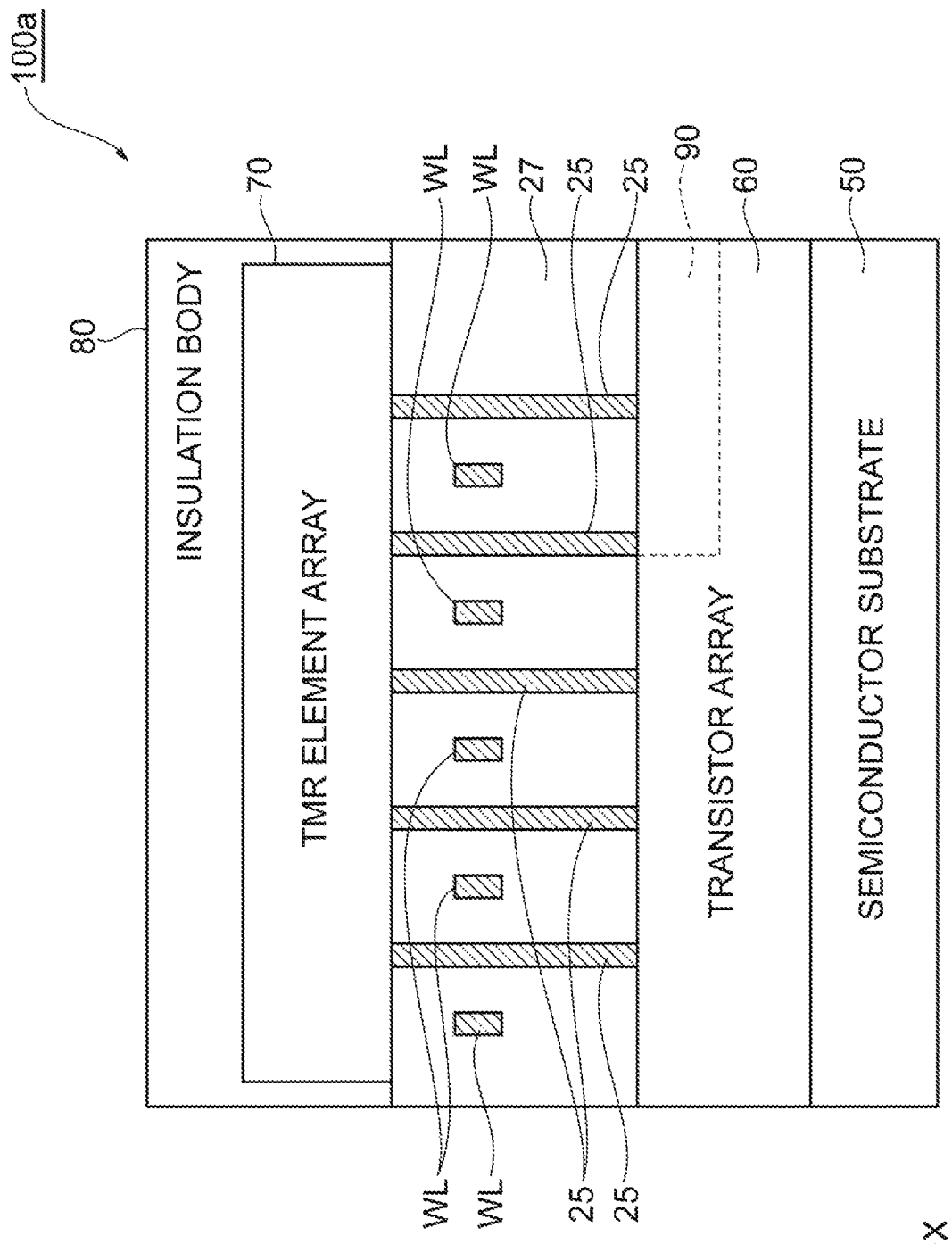
FIG. 25 is a schematic view of a vertical cross-section of an MRAM according to a modification example of the embodiment.

FIG. 25 is a schematic view of a vertical cross section of an MRAM according to a modification example of the present embodiment. An MRAM 100a according to the present modification example is different from the MRAM 100 of the basic aspect of the present embodiment in that the MRAM 100a further includes a processor 90. In the MRAM 100a, an MRAM part is formed as a part of a step of forming the circuit of the processor 90. Thus, the processor 90 and the MRAM part of the MRAM 100a are integrated. Thus, the MRAM 100a is a built-in memory. Accordingly, the speed of data exchange between the processor 90 and the MRAM part is increased.

REFERENCE SIGNS LIST

1 TMR ELEMENT
3 REFERENCE LAYER
5 TUNNEL BARRIER LAYER
7 MAGNETIZATION FREE LAYER
7E END PORTION REGION OF MAGNETIZATION FREE LAYER
7L CENTRAL REGION OF MAGNETIZATION FREE LAYER
9 PERPENDICULAR MAGNETIZATION INDUCING LAYER
11 LEAKAGE LAYER
15 MASK LAYER
17 SIDE WALL PORTION

The invention claimed is:

1. A magnetic memory comprising:
a tunnel magnetoresistive effect element as a storage element, wherein the tunnel magnetoresistive effect element comprises:
a reference layer;
a magnetization free layer;
a tunnel barrier layer stacked in a stack direction between the reference layer and the magnetization free layer;
a perpendicular magnetization inducing layer and a leakage layer stacked on a side of the magnetization free layer opposite to the tunnel barrier layer side wherein a bottom surface of the leakage layer is in physical contact with a portion of a top surface of the magnetization free layer;
a side wall portion formed of an insulation material and covering side surfaces of the reference layer, the tunnel barrier layer, the magnetization free layer, the perpendicular magnetization inducing layer, and the leakage layer, and
a mask layer formed of a conductive material and stacked on the perpendicular magnetization inducing layer and the leakage layer,
wherein a magnetization direction of the reference layer is fixed along the stack direction,
the perpendicular magnetization inducing layer imparts magnetic anisotropy along the stack direction to the magnetization free layer,
the leakage layer is disposed on an end portion region in an in-plane direction of the magnetization free layer,
the perpendicular magnetization inducing layer is disposed on at least a central region in the in-plane direction of the magnetization free layer,
a resistance value of the leakage layer along the stack direction per unit area in plane is less than a resistance value of the perpendicular magnetization inducing layer along the stack direction per unit area in plane,
the perpendicular magnetization inducing layer and the leakage layer are arranged along the in-plane direction of the magnetization free layer,
in a cross section parallel to the stack direction, a width in an in-plane direction of the leakage layer is greater than a thickness of the perpendicular magnetization inducing layer, and
the perpendicular magnetization inducing layer is configured such that a resistance value of the perpendicular magnetization inducing layer along the stack direction per unit area in a plane perpendicular to the stack direction is smaller than that of the tunnel barrier layer.

2. A built-in memory comprising:
the magnetic memory according to claim 1.

* * * * *